United States Patent [19]

Kim

[11] Patent Number: 5,778,446

[45] Date of Patent: Jul. 7, 1998

[54] RULE-BASED OPTIMIZING DRAM CONTROLLER

[75] Inventor: Jason Seung-Min Kim, Cerritos, Calif.

[73] Assignee: AST Research, Inc., Irvine, Calif.

[21] Appl. No.: 848,774

[22] Filed: May 2, 1997

Related U.S. Application Data

[63] Continuation of Ser. No. 408,891, Mar. 22, 1995, abandoned.

[51] Int. Cl.$^6$ .................................................. G06F 12/00
[52] U.S. Cl. ................................................. 711/167; 711/105
[58] Field of Search ........................... 395/557; 365/230.03, 365/222; 711/105, 106, 167, 169

[56] References Cited

U.S. PATENT DOCUMENTS

| | | | |
|---|---|---|---|
| 5,022,004 | 6/1991 | Kurtze et al. | 365/189.07 |
| 5,034,917 | 7/1991 | Bland et al. | 711/167 |
| 5,175,835 | 12/1992 | Beihge et al. | 395/432 |
| 5,210,856 | 5/1993 | Auvinen et al. | 395/550 |
| 5,265,236 | 11/1993 | Mehring et al. | 711/203 |
| 5,275,856 | 1/1994 | Norsworthy et al. | 395/550 |
| 5,278,967 | 1/1994 | Curran | 711/5 |
| 5,289,584 | 2/1994 | Thome et al. | 711/109 |
| 5,307,320 | 4/1994 | Farrer et al. | 365/230.01 |
| 5,418,924 | 5/1995 | Dresser | 395/494 |
| 5,465,343 | 11/1995 | Henson et al. | 711/112 |
| 5,479,635 | 12/1995 | Kametani | 711/5 |
| 5,499,353 | 3/1996 | Kadlec et al. | 395/445 |
| 5,504,877 | 4/1996 | Dornier | 395/550 |

Primary Examiner—Eddie P. Chan
Assistant Examiner—Hiep T. Nguyen
Attorney, Agent, or Firm—Knobbe, Martens, Olson & Bear, LLP

[57] ABSTRACT

A rule-based DRAM controller asserts memory access and control signals (including the CAS, RAS, WE, and address data signals) based upon pre-specified control rules. Certain pre-specified rules, or conditions, are used by the DRAM controller to determine the timing and sequence of the memory accessing and control signals output by the DRAM controller. The control rules for asserting the various memory accessing signals are advantageously implemented as logic within the DRAM controller, while the conditions and qualification for the control rules are provided from various monitoring signals and independently operating timing modules which keep track of the DRAM and controller states. Based upon these rules and conditions, the request inputs to the DRAM controller are interpreted to provide optimum access speed to the DRAM.

9 Claims, 15 Drawing Sheets

RULE-BASED OPTIMIZING DRAM CONTROLLER

This application is a continuation of U.S. patent application No. 08/408,891, filed Mar. 22,1995, now abandoned.

BACKGROUND OF THE INVENTION

1. Field of the Invention

The present invention relates to memory control circuits for dynamic random access memories (DRAMS).

2. Description of the Related Art

Dynamic random access memory (DRAM) controllers are used to control the flow of data in and out of a DRAM. A DRAM circuit, which is typically implemented as an application specific integrated circuit (ASIC), is configured like a two-dimensional matrix wherein a plurality of rows and columns define individual memory storage locations. In larger DRAM circuits, the memory may be divided into multiple sub-memories, or memory banks, and the different memory banks may be sub-divided into smaller memory regions (sometimes called pages). To access a given memory location, an asserted address signal specifies a row and another address signal specifies a column within the DRAM. If the DRAM includes memory banks, a further memory bank select signal is asserted to designate the memory bank having the specified row and column.

A DRAM controller determines the sequence and relative timing of memory accesses based upon an input address, a row address strobe signal, a column address strobe signal, and a read or write enable (WE) signal. In addition, a memory bank select signal may also be used to control accesses to the DRAM. When a memory access is initiated, a central processing unit (CPU) or other memory accessing device asserts an address comprising a plurality of address lists which are received by the DRAM controller. When the row address strobe signal is asserted, this causes a first portion of the address bits applied to the DRAM controller to be interpreted as the address of a row within the DRAM. Consequently, all of the row designated by the row address lists to the DRAM when the row address strobe signal is asserted are enabled, or energized. That is, each of the individual memory storage locations within the energized row outputs a bit value (i.e., either a high voltage or a low voltage corresponding to either a one or a zero). The base of each column within the DRAM includes a sense amplifier ("sense amp") coupled thereto which detects the value of the data bits which are stored within the memory locations along the activated row of the DRAM. Subsequently, when the column address strobe signal is asserted, this causes a second portion of the address input bits applied to the DRAM controller to be interpreted as column address bits. Based upon the column address bits, one of the sense amplifiers is selected to provide the detected output (e.g., in the event that a read enable signal is asserted) so that the data bit detected by the selected sense amp is output as data. In the event that a write enable (WE) signal is activated instead of a read enable, a high or low voltage signal is applied to a data line which indicates the bit value which will be stored at the memory cell in the activated row and column. In this manner, data may be read out from the DRAM (if the output enable or read enable signal is asserted) or stored within the DRAM (if the write enable (WE) signal is asserted).

As is well known in the art, the assertion of the row address strobe signal, the column address strobe signal, the write or read enable signal, and the memory bank select signal all involve certain delay times, or latencies, due to, for example, the time it takes to charge up or discharge a row, the time it takes to assert a signal so that the asserted signal is at the proper voltage level to be detected accurately, the recovery time necessary after each memory access, etc. Thus, for example, if the column address strobe signal is asserted too soon after the row address strobe signal has been asserted, then it is possible that the row within the DRAM to be energized at the designated address may not yet be fully charged, so that it is likely that an inaccurate reading may be obtained by the activated sense amp at the end of the selected column. Thus, it is essential that the timing among the various signals used to access the DRAM memory be controlled very carefully so that accurate data is read from and written to the DRAM. However, information processing systems are becoming faster and faster with ever increasing clock rates so that high speed memory accesses to the DRAM are of utmost importance to ensure maximum performance of such information processing systems. In order to increase memory access speed, it is important to minimize the delay times associated with each of the access signals, while ensuring accurate data reads and writes. Thus, if the column address strobe signal is asserted for too long of a time after the row address signal has already been asserted and is valid, valuable access time may have been wasted. Thus, it is highly beneficial to assert each of the accessing signals as soon as valid data is guaranteed.

To this end, a number of memory accessing schemes have been developed to carefully monitor and control the timing of the respective accessing signals (e.g., the row address strobe signal, the column address strobe signal, the read or write enable (WE) signal, the memory bank select signal, etc.). For example, some DRAM controllers are implemented to include fixed timing values which designate how long each signal is to be asserted or unasserted, the delay between the assertion of one signal and the assertion of another signal, etc. However, such DRAM controllers are not adaptable to various DRAM circuits having various memory accessing characteristics. Thus, such controllers are not likely to be compatible with older DRAM circuits, nor are such controllers likely to be compatible with future DRAM circuit configurations. Thus, each time a new DRAM circuit is to be implemented, a new DRAM controller would also be necessary.

Other DRAM controllers are designed to work in conjunction with several different DRAM configurations so as to be backward and forward compatible. Since the latencies associated with each of the data accessing signals required for the accurate accessing of valid data vary from memory to memory, such memory controller circuits include programmable timing registers which indicate the latencies associated with each of the accessing signals. Thus, for example, a register may be used to store a value corresponding to the delay time required between the assertion of the row address strobe signal and the assertion of the column address strobe signal. A further register may be used to store a value indicative of the delay time associated with the release of the row address strobe signal and the reassertion of the same row address strobe signal. In such systems, values are loaded into each of the latency registers. For example, the value loaded into a latency register may comprise a certain number of clock cycles which are to be observed between the assertion of one signal and the assertion of another signal. By including programmable latency registers, different DRAMs may be used with different memory controllers, since the memory controllers can be programmed to correspond to the latency constraints and other characteristics associated with the configuration of each DRAM.

However, certain difficulties are associated with such systems which include programmable latency registers. Specifically, such systems must provide for a worst-case scenario in the latency expected for each of the memory access signals. That is, if certain conditions which vary from memory access cause a significant change in the latencies associated with each of the accessing signals, then the programmable registers must assume latency times which are maximum given the possible conditions. For example, when a DRAM is divided into a plurality of memory banks, or sub-memories, and each of these memory banks includes a matrix of rows and columns, memory accesses may be directed to any point in the DRAM so that in one case successive memory accesses may be to the same row but just different columns, which condition results in a very short latency time; while other successive memory accesses may be to different rows within the same memory bank, which results in a somewhat longer latency time; while other memory accesses are made from one memory bank to another memory bank, which results in an even longer latency time. Since the memory controller is unable to predict the sequence of memory accesses, the programmable registers must contain values that assume that each memory access will require the longest possible time delay between accesses. This is especially true in multi-tasking application programs which typically do not access the same memory location areas within the DRAM for extended periods.

Furthermore, the number of different latencies associated with each of the memory accessing signals can be quite large so that more and more programmable registers must be used to determine the latencies associated with and among each of the memory accessing signals. Thus, the number of registers may become so large that it is prohibitive to provide a programmable register time for each of the latencies associated with and among the memory accessing signals.

Thus, it is apparent that memory controllers which control the assertion of the different memory accessing signals based upon values stored within programmable latency registers have a number of significant disadvantages. Namely, such systems typically do not provide the fastest possible memory access time since these systems rely on a worst-case scenario analysis of the relative signal timings of the memory access signals and such systems typically have a large number of registers for each of the latencies associated with the memory accessing signals.

SUMMARY OF THE INVENTION

A rule-based memory controller for use in a computer processor system includes a memory which is accessible by timing signals. The timing signals have multiple timing relations that are definable by a set of rules which govern the assertion of the timing signals. The memory controller comprises monitoring circuitry which monitors input signals that serve as pre-specified conditions for asserting the timing signals; and logic circuitry connected to the monitoring circuitry and responsive to the input signals to assert and unassert the memory accessing timing signals. The logic circuitry is used to implement multiple firing rules which allow for optimum accessing of the memory using the timing signals based upon the pre-specified conditions.

In a preferred embodiment, the controller includes a plurality of programmable timing registers which communicate with the monitoring circuitry and the logic circuitry. The timing data stored within the timing registers serve as inputs which qualify the firing rules. In a particularly preferred embodiment, the monitoring circuit includes a plurality of counters, and the timing registers provide data inputs to the counters.

In a further embodiment, the memory circuit comprises a dynamic random access memory (DRAM). In still another embodiment, the computer processing system is a multi-processor system.

The rule-based memory controller may further be implemented so that the logic circuitry comprises row address select logic and/or column address select logic.

Under another aspect, the present invention is a memory circuit for use within a computer processing system. The memory circuit comprises a dynamic random access memory (DRAM) accessed by timing signals. The timing signals are indicative of a state of the DRAM. The memory circuit further comprises a DRAM controller which includes logic for controlling memory accesses to the DRAM and further includes a plurality of timing circuits which emulate control states within the DRAM to monitor the internal state of the DRAM and to provide information relating to the internal state of the DRAM to the logic.

DETAILED DESCRIPTION OF THE INVENTION

In accordance with the teachings of the present invention, a DRAM controller is specially designed to control the sequence and timing of the various memory accessing signals on the basis of certain rules. The inventor has recognized that the optimum sequence and associated latencies of the memory accessing signals may be reduced to a set of principles from which each of the particular signal timings and latencies may be derived. Such a system is not entirely dependent upon specific numerical values to provide control of the memory accessing signals. Furthermore, by resolving the operation of the memory controller to a few fundamental principles, the number of programmable registers needed is reduced.

In accordance with the present invention, the sequence and timing of the various memory accessing signals is determined by the detection of certain conditions and the application of rules to those conditions. Thus, the memory controller receives inputs which relate to the operation of the DRAM. These inputs serve as conditions which are monitored by the DRAM controller. If certain conditions are satisfied, then the DRAM controller will assert corresponding memory access signals (e.g., the row address strobe or column address strobe signals). The DRAM controller is specially configured to determine if the conditions for asserting a memory access signal have been met.

Rules may be laid down which express which conditions must be met in order for a given signal to be asserted. Thus, the DRAM controller of the present invention is a "rule-based" DRAM controller. The "rule-based" DRAM controller of the present invention advantageously uses special logic to implement the rules used to determine the assertion of the various memory access signals. Thus, the rules are embodied, or "hard-wired" within the configuration of the DRAM controller.

Figure 1:
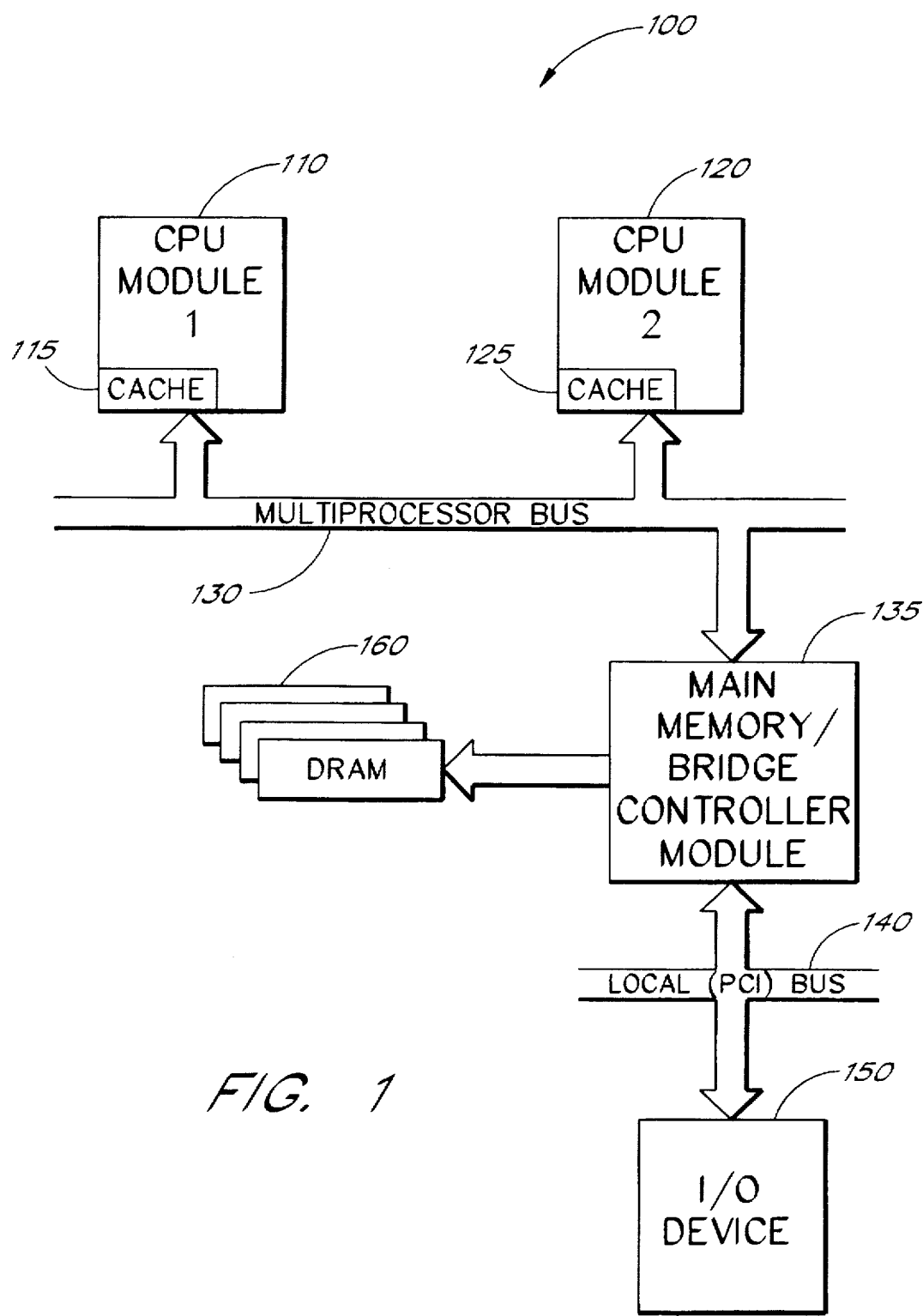
FIG. 1 is an overall schematic block diagram of a multi-processor system which includes a main memory module accessible by multiple devices.

FIG. 1 depicts a multiprocessor computing system 100. The computing system 100 includes a CPU module 110 which includes a cache memory 115 and a CPU module 120 which includes a cache memory 125. As is well understood in the art, each CPU module 110, 120, includes conventional circuitry such as a central processing unit, a bus controller, a bus interface, and other conventional circuitry which are not shown here. The CPU modules 110, 120 communicate with one another via a multiprocessor bus 130. As is well known in the art, the multiprocessor bus 130 may include a central arbitrator (not shown) which receives requests for possession of the multiprocessor bus 130 and grants possession of the multiprocessor bus 130 to selected requesting devices. The multiprocessor bus 130 also acts as a communication link between each of the CPU modules 110, 120 and a main memory controller module 135. The main memory controller module 135 acts as a bridge controller which provides access to a DRAM 160 from the CPU modules 110, 120 as well as from an input/output (I/O) device 150 via a local PCI bus 140. The I/O device 150 may, for example, comprise a disk drive, a keyboard, etc. The main memory controller module 135 also includes control and interface circuitry (not shown in FIG. 1).

In operation, each of the CPU modules 110, 120 can initiate either a read or a write-back cycle wherein data is either read from or written back, respectively, to the main memory controller module 135. During a read cycle, the CPU module 110 or the CPU module 120 transmits a signal along the multiprocessor bus 130 indicating that data is to be read from a given address within the DRAM 160. Once a valid address has been placed on the multiprocessor bus 130 by one of the CPU modules 110, 120, then the main memory controller module 135 receives the issued address and retrieves the data located at the specified memory address. The main memory controller module 135 then outputs the data stored at the given address onto the multiprocessor bus 130 where the requesting CPU module 110, 120 retrieves the data.

The I/O device 150 is also able to access the DRAM memory 160 via the main memory controller module 135 and the PCI bus 140. Typically, the I/O device 150 will read data from, or write data to, memory addresses within the DRAM 160.

Figure 2:
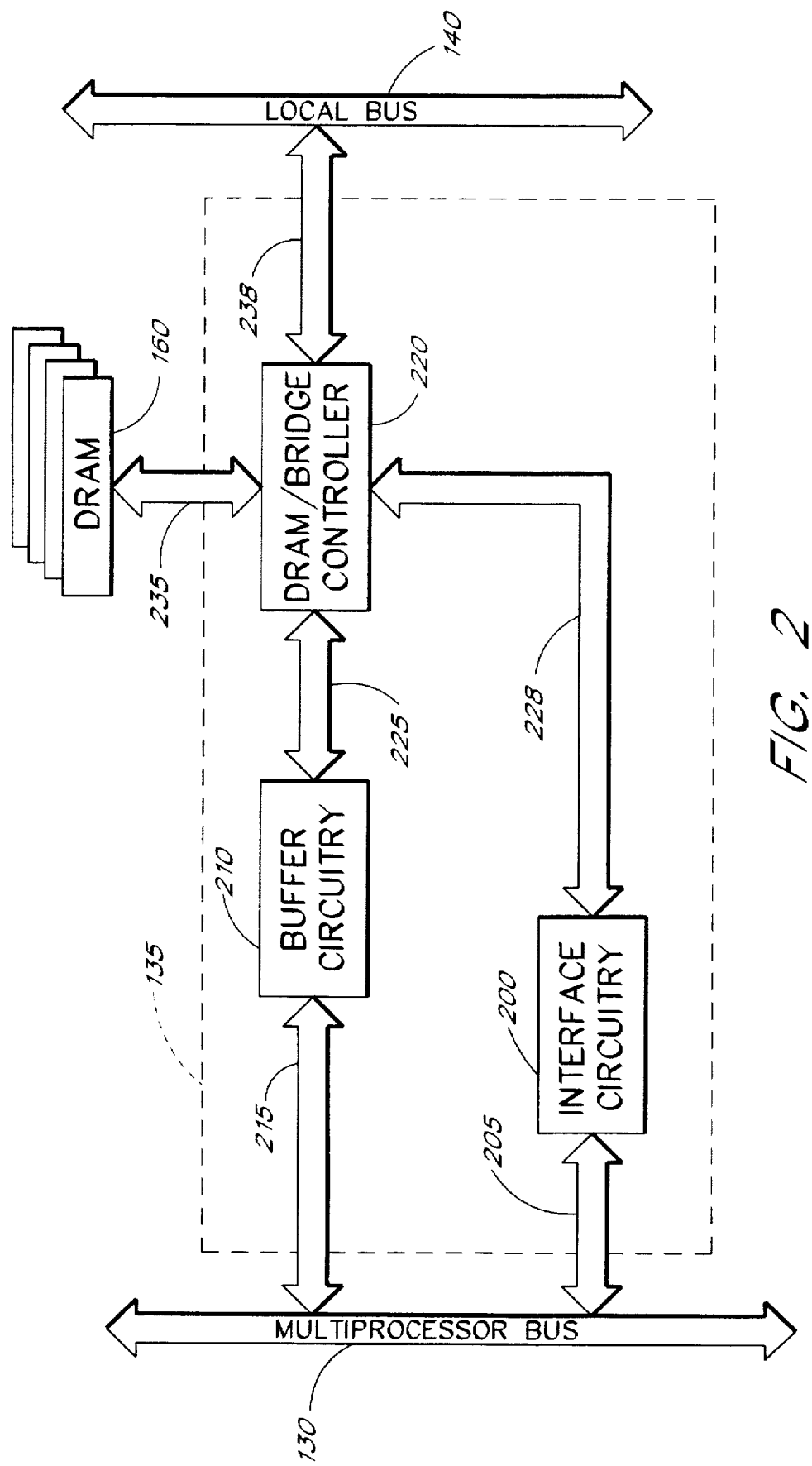
FIG. 2 is a simplified schematic block diagram which details the main functional internal circuitry within the main memory module of FIG. 1.

FIG. 2 is a simplified schematic block diagram showing the main functional internal circuitry within the main memory controller module 135 of FIG. 1. As shown in FIG. 2, the system bus 130 communicates with interface circuitry 200 via a control bus 205, while the system bus 130 further communicates with buffer circuitry 210 via a data and address bus 215. The buffer circuitry 210 communicates with a DRAM controller 220 via a bus 225 while control signals are passed from the interface circuitry 200 to the DRAM controller 220 via an internal control bus 228. The DRAM controller 220 communicates with the DRAM 160 via a data and address bus 235. The local PCI bus 140 further communicates with the DRAM controller 220 via a data address and control bus 238.

In operation, the system bus 130 provides control signals to the DRAM controller 220 via the bus 205, the interface circuitry 200, and the internal control bus 228. The system bus 130 further provides data and address information to the DRAM controller 220 via the bus 215, the buffer circuitry 210, and the bus 225. A DRAM controller 220 receives the control signals from the interface circuitry 200 and the data and address information from the buffer circuitry 210 and selectively accesses memory locations within the DRAM 160 via the bus 235 based upon the received address, data and control signals. In like manner, the local bus 140 may provide data address and control signals to the DRAM controller 220 via the bus 238, so that the DRAM controller 220 accesses the memory locations within the DRAM 160 specified by the data address and control signals provided over the bus 238.

As is well known in the art, addresses received by the DRAM controller 220 are typically divided into segments used to access one of the memory banks within the DRAM 160, a selected row within the designated memory bank, and a selected column within the designated memory bank. Thus, for example, the two most significant bits of the address location designate which one of four memory banks within the DRAM 160 is to be accessed, while the next 10 most significant bits are used to designate which row will be accessed within the selected memory bank, and finally the least 10 significant address bits are used to select one of the columns within the designated memory bank of the DRAM 160. Other selections of address lists may also be used. For example, the row address bits may not necessarily be contiguous.

Figure 3:
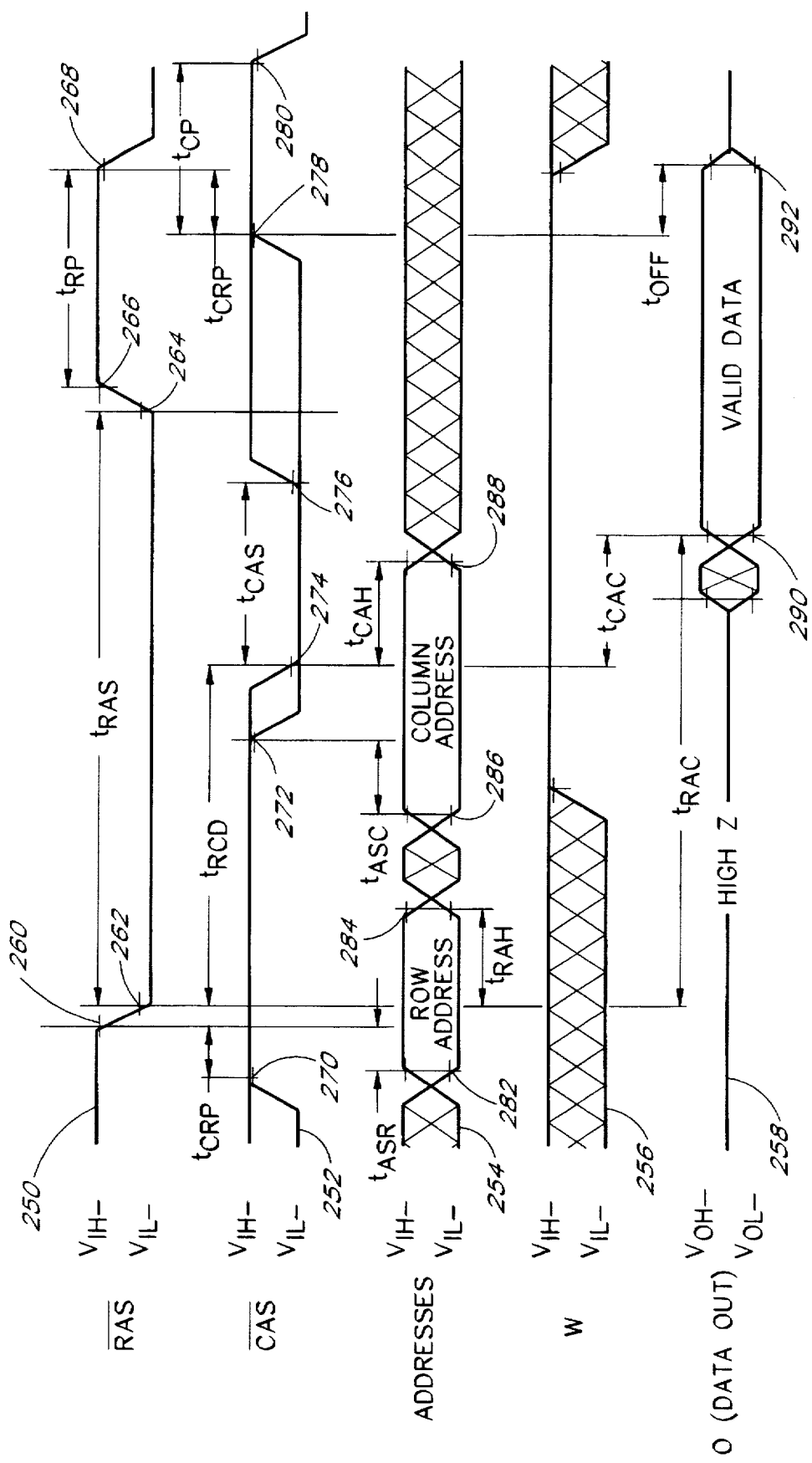
FIG. 3 is a timing diagram which illustrates the timing relationships among the main signals used during an exemplary read cycle memory access wherein data within the DRAM of FIGS. 1 and 2 is read under the control of the DRAM controller of FIG. 2.

FIG. 3 is a timing diagram which is exemplary of a typical read cycle wherein the DRAM controller 220 accesses data within the DRAM 160 in order to read data from the DRAM 160. As shown in FIG. 3, four main signals are output by the DRAM controller 220 to access data within the DRAM 160. Specifically, an active low row address strobe signal (RAS) 250 is asserted to energize a selected row within the DRAM 160. An active low column address strobe signal 252 is used to select a particular column within the DRAM 160. Address signals 254 are used to specify the row or column to be energized when the RAS or CAS signals are asserted. A write enable (WE) signal 256 is an active low signal which is used to specify whether the accessed data within the DRAM 160 is to be read from the DRAM 160 or written into the DRAM 160. Although not depicted here, a memory select signal may also be used to select a memory bank within the DRAM 160 when the DRAM 160 comprises multiple banks of memory. A data out signal 258 represents valid data which is output from the DRAM 160 from the designated row and column address during a read cycle.

The memory read sequence depicted in FIG. 3 begins with the assertion of a valid address 254 on the bus 235 at the input of the DRAM 160. Once the valid address 254 is present on the bus 235, the RAS signal 250 is asserted over the bus 235 to latch in the row address and thereby energize the row designated by the input address signal 254. Once the row address has been latched into registers within the DRAM 160, a valid column address is placed on the bus 235. Subsequently, the CAS signal 252 is asserted to latch the column address into the DRAM 160. The write enable signal 256 is maintained inactive so that data is read without being changed. The data is consequently output to the DRAM controller 220 over the bus 235, as represented by the "VALID DATA" portion of the signal 258 in FIG. 3.

As shown in FIG. 3, a number of timing relations exist amongst the memory access signals 250–256 and the data output signal 258. It will be understood, of course, that the timing relations depicted in FIG. 3 are exemplary and do not necessarily represent all of the possible timing relations which may be significant for purposes of controlling memory accesses to the DRAM 160 by means of the DRAM controller 220.

A time duration $t_{RAS}$ extends between a point 262 on the RAS signal 250 and a point 264 on the RAS signal 250. The point 262 designates the time when the RAS signal 250 has crossed a low voltage threshold and completed the transition from the unasserted state to the asserted state (since the RAS signal 250 is active low). The point 264 indicates that the RAS signal 250 has crossed the low voltage threshold to begin the transition from the asserted state to the unasserted state. The time period designated by $t_{RAS}$ represents the pulse width of the RAS signal 250.

A time duration represented by $t_{RP}$ extends from a point 266 on the RAS signal 250 to a point 268 on the RAS signal 250. The point 266 designates where the RAS signal 250 crosses a high voltage threshold, indicating that the RAS signal 250 is deasserted (i.e., has completed the transition from the asserted state to the unasserted state). The point 268 designates the time when the RAS signal 250 crosses below the high voltage threshold to indicate that the RAS signal 250 is beginning the transition from the unasserted state to the asserted state. The duration represented by $t_{RP}$ is the RAS precharge time which is the time necessary for a given row within the DRAM 160 to be precharged before the RAS signal 250 may be asserted.

A time duration designated by $t_{CRP}$ extends between a point 260 on the RAS signal 250 and a point 270 on the CAS signal 252. The point 260 is where the RAS signal 250 crosses below the high voltage threshold, indicating that the RAS signal 250 is beginning to transition from the unasserted state to the asserted state, while the point 270 indicates the place where the CAS signal 252 crosses above the high voltage threshold so that the CAS signal 252 is deasserted (since the CAS signal 252 is active low). The time duration $t_{CRP}$ is the CAS to RAS precharge time, which is the minimum time necessary between deassertion of the CAS signal 252 and assertion of the RAS signal 250.

A time duration $t_{RCD}$ extends between the point 262 on the RAS signal 250 and a point 274 on the CAS signal 252. The point 274 on the CAS signal 252 indicates the place where the CAS signal 252 passes below the low voltage level threshold so that the CAS signal 252 is clearly asserted. The time duration $t_{RCD}$ is the delay time between the assertion of the RAS signal 250 and the assertion of the CAS signal 252 (i.e., the time it takes to energize a column once the appropriate row has been energized).

A time duration indicated by $t_{CAS}$ extends from the point 274 to a point 276. The point 276 is the point on the CAS signal 252 where the CAS signal 252 crosses above the low voltage threshold, indicating that the CAS signal 252 is transitioning from the asserted state to the unasserted state. Thus, the time duration indicated by $t_{CAS}$ is the pulse width of the asserted CAS signal.

A time duration indicated by $t_{CRP}$ extends from a point 278 on the CAS signal 252 to the point 268 on the RAS signal 250. The point 278 on the CAS signal 252 is the point where the CAS signal 252 crosses above the high voltage threshold level, indicating that the CAS signal 252 is deasserted. As explained above, the $t_{CRP}$ signal is the CAS to RAS precharge time which is required when a transition is made to a new page of memory within the DRAM 160.

A time duration designated by $t_{CP}$ extends from the point 278 to a point 280 on the CAS signal 252. The point 280 is the point on the CAS signal 252 where the CAS signal 252 transitions below the high voltage threshold level, thereby indicating that the CAS signal 252 is transitioning from the deasserted state to an asserted state. The time duration indicated by $t_{CP}$ is the column access precharge time (i.e., the time which is required to precharge a given column before the CAS signal 252 can be asserted for addresses at that column).

A time duration designated by $t_{ASR}$ extends between a point 282 on the address signal 254 where address data becomes valid and the point 260 on the RAS signal 250. The time duration represented by $t_{ASR}$ is the row address set-up time (i.e., the time required from the instant that row address data becomes valid and the RAS signal 250 is asserted).

A time duration $t_{ASR}$ extends between the point 262 on the RAS signal 250 and a point 284 on the address signal 254. The point 284 is where the row address data is no longer valid. The time duration indicated by $t_{RAH}$ is the row address hold time (i.e., the time between the actual assertion of the RAS signal 250 and the instant where the row address data is no longer valid).

A time duration $t_{ASC}$ extends between a point 286 on the address signal 254 and a point 272 on the CAS signal 252. The point 286 on the address signal 254 is the instant where the column address data is valid at the input to the DRAM 160, while the point 272 on the CAS signal 252 is the point where the CAS signal 252 crosses beneath the high voltage threshold, indicating a transition from the deasserted state to the asserted state. The time duration designated by $t_{ASC}$ is the column address set-up time (i.e., the time between the instant where the column address data is valid at the input of the DRAM 160 and the CAS signal 252 begins to be asserted).

A time duration $t_{CAH}$ extends between the point 274 on the CAS signal 252 and a point 288 on the address signal 254. The point 288 on the address signal 254 is the instant where the column address data ceases to be valid at the input of the DRAM 160. The time period indicated by $t_{CAH}$ is the column address hold time (i.e., the time for which the column address data must be held valid once the CAS signal 252 has been actually asserted).

A time duration $t_{CAC}$ extends between the point 274 on the CAS signal 252 and a point 290 on the data output signal 258. The point 290 on the data output signal 258 is the instant when valid data is first present at the output of the DRAM 160. The time duration $t_{CAC}$ is the access time from the assertion of the CAS signal 252 (i.e., the time between the actual assertion of the CAS signal 252 and the instant where data is first valid at the output of the DRAM 160).

A time duration $t_{RAC}$ extends between the point 262 on the RAS signal 250 and the point 290 on the data output signal 258. The time duration designated by $t_{RAC}$ is the access time from the actual assertion of the RAS signal 250 (i.e., the time between the actual assertion of the RAS signal 250 and the first instant at which valid data is present at the output of the DRAM 160).

A time duration indicated by $t_{OFF}$ extends between the point 278 on the CAS signal 252 and a point 292 on the data output signal 258. The point 292 on the data output signal 258 is the instant at which valid data ceases to be present at the output of the DRAM 160. The time duration designated by $t_{OFF}$ is the output buffer and turn-off delay (i.e., the time which it takes for valid data to cease to be present at the output of the DRAM 160 once the CAS signal 252 has ceased to be asserted).

Timing relations other than those depicted in FIG. 3 will be discussed below, as necessary, to further clarify the operation of the DRAM controller 220 of the present invention.

Figure 4:
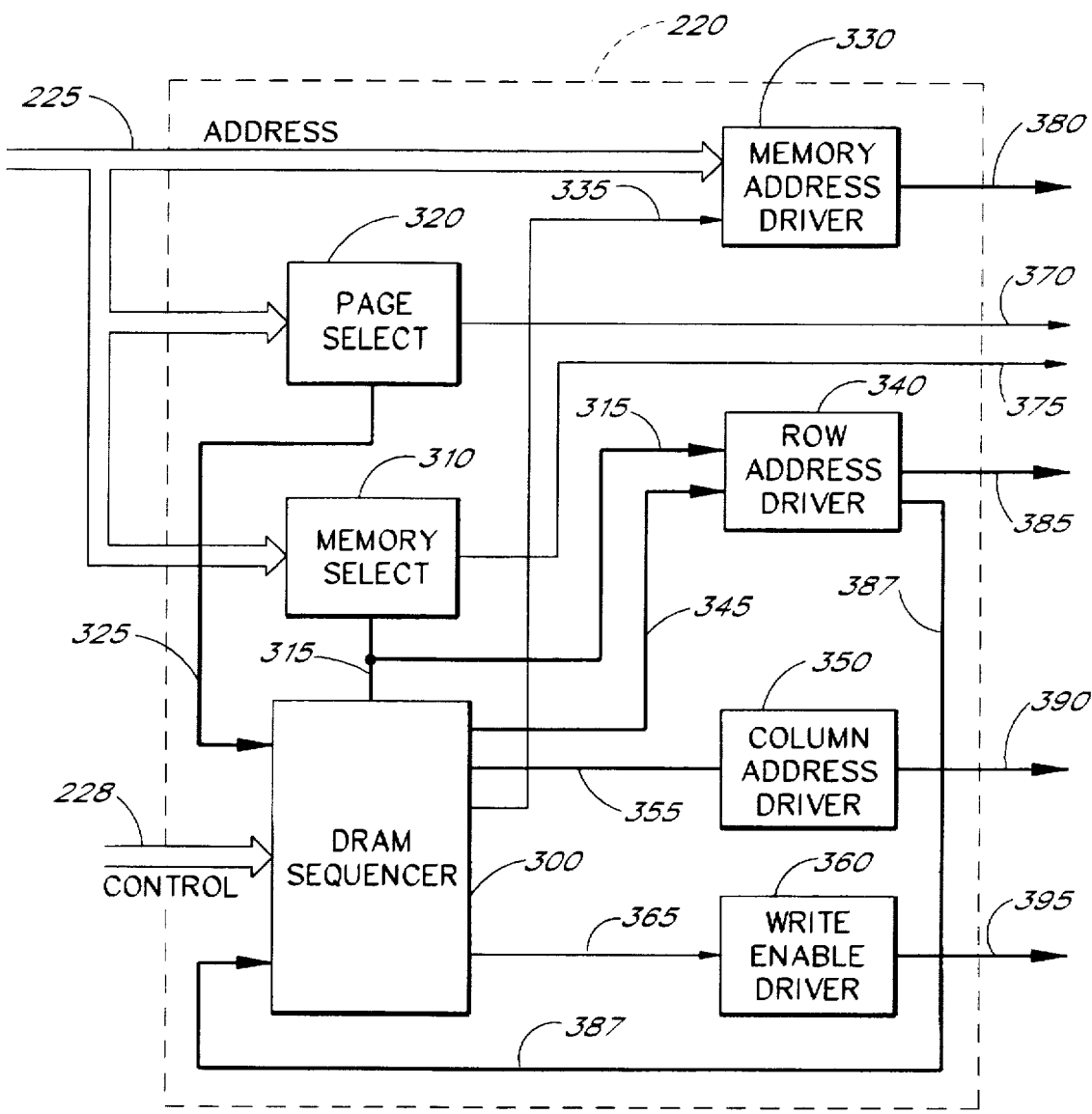
FIG. 4 is a simplified schematic block diagram showing the main functional elements contained within the DRAM controller of FIG. 2.

FIG. 4 is a simplified schematic block diagram which details the main internal, functional components of the DRAM controller 220 of FIG. 2. As shown in FIG. 4, the DRAM controller 220 includes a DRAM sequencer 300 which receives inputs from the control bus 228, and memory and page select circuits 310, 320, respectively, which receive inputs from the data and address bus 225 (or, alternately, from the I/O bus 238). The DRAM sequencer 300 communicates bi-directionally with the memory select circuit 310 via a communication bus 315 and communicates with the page select circuit 320 via a communication bus 325. The DRAM sequencer 300 further provides outputs to a memory address driver 330 via a line 335, a row address driver 340 via a bus 345, a column address driver 350 via a bus 355, and a write enable driver 360 via a line 365. The page select and memory select circuits 320, 310 respectively provide outputs 370, 375 from the DRAM controller 220. The drivers 330-360 respectively provide outputs 380-395 from the DRAM controller 220. The outputs 370-395 are provided to the DRAM 160 via the bus 235 (see FIG. 2). The row address driver 340 provides outputs to the DRAM sequencer 300 via a bus 387.

In operation, address data are supplied to the page and memory select circuits 310, 320, while control data are input to the DRAM sequencer 300. The page and memory select circuits 320, 310 determine which memory bank, and which page in memory are to be accessed. The DRAM sequencer 300 determines the timing of the assertion of the control signals used for memory accesses to the DRAM 160. More specifically, based upon the control inputs and based upon the inputs from the memory select 310, the page select 320 and the row address driver 340 over the signal busses 315, 325, and 387, respectively, the DRAM sequencer generates driving signals to the memory address driver 330, the row address driver 340, the column address driver 350 and the write enable driver 360. The memory address driver 330 outputs a ten-bit address signal to the DRAM 160 (see the exemplary address signal 254 of FIG. 3). The row address driver 340 outputs a row address strobe signal for each of, for example, four memory banks (see the exemplary row address strobe signal 250 of FIG. 3). The column address driver 350 outputs a column address strobe signal for each of, for example, four memory banks (see the exemplary column address strobe signal 252 of FIG. 3). The write enable driver 360 outputs a read/write enable (WE) signal to each memory bank (see the exemplary write enable (WE) signal 256 of FIG. 3).

Figure 5:
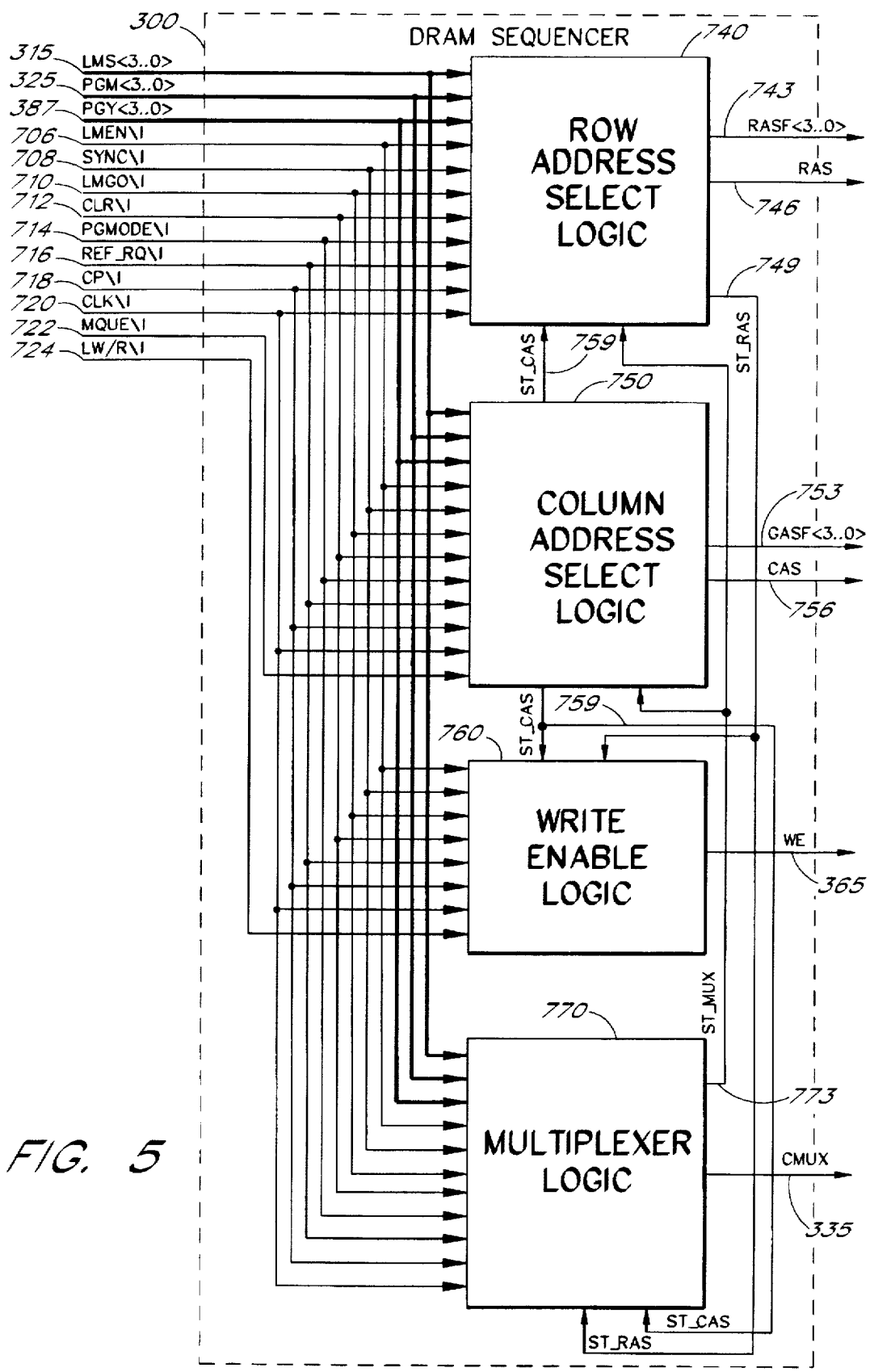
FIG. 5 is a schematic block diagram which depicts the main functional elements of the DRAM sequencer of FIG. 4.

FIG. 5 is a schematic block diagram which depicts the main functional elements of the DRAM sequencer 300 depicted in FIG. 4. The DRAM sequencer 300 receives inputs on busses 315, 325, 387 and lines 706-724 (comprising the control bus 228 in FIG. 4). Specifically, the four-bit local memory select bus 315 provides a four-bit input value which, when asserted, indicates that the current memory access is to one of the memory banks within the DRAM 160 and, when unasserted, indicates that the current memory address is to one of the CPU modules 110, 120 or the I/O device 150. In one embodiment, the DRAM 160 includes four memory banks so that each of the four bits of the local memory select bus 315 corresponds to one of the memory banks within the DRAM 160. The four-bit page select bus 325 provides a four-bit input value which indicates if a memory page is open in a given memory bank. When a memory page is open in a given memory bank, any column address accesses to the open page can be serviced immediately without having to regenerate the row address. Again, one bit is provided for each memory bank so that the assertion of the first line indicates that a page is currently open in the first memory bank, the assertion of the second line indicates that a page is open in the second line, etc. The four-bit page hit bus 387 provides a four-bit input value which indicates if the same page which was accessed by the last memory address is also accessed by the current memory address. Thus, the first bit line of the four-bit page hit bus 387 is asserted if the same page within the first memory bank is accessed, while the second line of the page hit bus 387 is asserted if the same page is accessed within the second memory bank, etc.

A local memory enable line 706 is asserted when the DRAM 160 is to be activated. A synchronized input line 708 is asserted when the system bus 110 is synchronized with the DRAM 160. In one actual embodiment, the CPU bus (i.e., the system bus 110) has a slower clock rate than the internal clock rate of the DRAM controller 220. Thus, before data is to be input or output from the DRAM controller 220, the clock pulses from the system bus 110 have to be synchronized with the clock pulses within the internal clock of the DRAM controller 220 to ensure proper operation and transaction of data between the system bus 110 and the DRAM 160. A local memory go line 710 is asserted when a data read or write is to begin to the local DRAM. The local memory go line 710 remains asserted until all data is written or read from the local DRAM. An input clear line 712 is used to reset the DRAM sequencer 300. A page mode (PGMODE) input line 714 is asserted when the DRAM 160 is configured so that there is significant time savings when memory is accessed in consecutive columns in the same row (i.e., when accesses to different pages or accesses to different rows are significantly slower than accesses to different columns within the same row). A refresh request line 716 is asserted when it is determined that it is necessary to refresh a given page within a memory bank of the DRAM 160. An input clock pulse line 718 provides the clock pulse synchronized with the faster internal DRAM clock. A clock input line 720 provides the memory control bus clock (i.e., the clock operating on the system bus 110) as an input to the DRAM sequencer 300. A memory access queued line 722 is pulsed at each access of the DRAM 160. That is, as is well known in the art, a plurality of memory accesses may be queued so that each of the memory addresses within the memory access queue are strobed in by means of the memory access que signal issued on the line 722. Finally, a local write/read line 724 serves as input to the DRAM sequencer 300 and is asserted to indicate that the current memory access is a memory write, while the line 724 is left unasserted if the current memory access is a memory read.

Selected ones of the input busses 315, 325, 387 and input lines 706-724 act as inputs to a row address strobe logic circuit 740, a column address strobe logic circuit 750, a write enable logic circuit 760, and a multiplexer logic circuit 770. The row address strobe logic 740 provides a four-bit refresh output on a row address strobe refresh (RASF) bus 743. In addition, the row address strobe logic 740 outputs the row address strobe (RAS) signal to the row address driver 340 over a row address strobe line 746. A row address strobe state line 749 carries a signal indicating the state of the row address strobe (RAS) signal to the write enable and multiplexer logic 760, 770. The bus 743 and the line 746 together comprise the bus 345 of FIG. 4.

The column address strobe logic 750 provides a four-bit column address strobe refresh (CASF) signal over an output bus 753 together with the column address strobe (CAS) signal over a line 756. In addition, the column address strobe logic 750 outputs a state column address strobe line 759. The column address strobe refresh bus 753 and the column address strobe line 756 together comprise the bus 355 of FIG. 4.

The write enable logic circuit 760 outputs a write enable (WE) signal over the line 365. The multiplexer logic circuit 770 outputs the multiplex select line 335 as well as a state multiplex signal over a line 773.

Also included within the DRAM sequencer 300, but not shown here in FIG. 5, are timing and other logic circuits which are used to generate additional output signals from the DRAM sequencer of 300. The timing circuits together with the other logic circuits within the DRAM sequencer 300 not shown in FIG. 5 will be described in greater detail below with reference to FIGS. 7–10.

Based upon the values asserted on the buses 315, 325, 387 and the lines 706–720, the row address strobe logic 740 outputs a four-bit row address strobe refresh signal (RASF) over the bus 743 and a row address strobe (RAS) driving signal over the line 746. The signals output over the bus 743 and the line 746 are determined in accordance with certain rules, which are preferably implemented as logic within the row/address select logic 740. Furthermore, in addition to the signals provided by the input buses 315, 325, 387 and the input lines 706–720, the row address strobe logic 740 further includes internal timing registers which keep track (in units of clock cycles) of the amount of time for which various signals are asserted.

As an example, listed below are some of the "firing-rules" used for the generation of the row address strobe (RAS) signal where timing conditions are provided by internal timing generators.

Rule 1: Assert row address strobe (RAS) when the following conditions are met:

1. A memory access request has been made and a refresh cycle is not in progress;
2. The row address has been multiplexed onto the DRAM for a sufficient set-up time; and
3. The row address strobe (RAS) signal has been deasserted for a sufficient time to satisfy the row address strobe (RAS) precharge constraints.

Rule 2: Assert the row address strobe (RAS) signal when the following conditions are met:

1. A memory access request has been made and the refresh cycle is not in progress;
2. The row address has been multiplexed onto the DRAM for a sufficient set-up time; and
3. The memory access range is on a different memory bank.

Rule 3: Assert the row address strobe (RAS) signal when the following conditions are met:

1. A memory access request has not been made and the refresh cycle has been granted; and 2. The column address strobe (CAS) signal has been asserted for a sufficient time to satisfy the column address strobe (CAS) set-up refresh time.

As an example, the conditions of Rule 1 are satisfied when the local memory go line 710 is asserted and the refresh request line 716 is unasserted; the timer internal to the row address strobe logic 740 which keeps track of the amount of time for which the row address has been multiplexed onto the DRAM has expired; and the timer internal to the row address strobe logic 740 which keeps track of the amount of time the row address strobe (RAS) signal has been deasserted has expired (i.e., counted down). It should be noted here that this rule is a generic rule for the generation of a row address strobe (RAS) signal for most standard DRAM access cycles.

Each of the criteria required to assert the row address strobe (RAS) signal on the line 746, as outlined above, will be reduced to input signals on the busses 315, 325, 387 and the lines 706–720, 749, 759, and 773 in order to more clearly relate the signals input to the row address strobe logic 740 to the above enunciated rules. For example, as outlined above in accordance with Rule 1, the row address strobe (RAS) signal is asserted when 1) a memory access request has been made and the refresh cycle is not in progress; 2) the row address has been multiplexed onto the DRAM for a sufficient set-up time; and 3) the memory access range is on a different memory bank.

A memory access request has been made either when: 1) a local memory go (LMGO) signal has been asserted on the line 710; or 2) a local memory enable signal on the line 706 has been asserted and the synchronization signal on the line 708 has been pulsed for one cycle of the system bus clock.

The refresh cycle is not in progress when either 1) a memory access request has been made or the refresh request signal has not been asserted over the line 716 or the column address strobe (CAS) signal is being asserted via the line 759 or the row address strobe (RAS) signal is being asserted via the line 749; or 2) a memory access request has been made or the refresh request signal has not been asserted over the line 716 or the column address strobe (CAS) signal is being asserted via the line 759 or the timing signal indicating that it the row address strobe (RAS) signal is to be deasserted has not yet been asserted. This timing signal is asserted when a row address strobe (RAS) hold counter (not shown), having a preset timing value, expires to indicate that the row address strobe (RAS) signal is to be deasserted.

The row address has been multiplexed onto the DRAM for a sufficient length of time when a row address setup timer (not shown) has expired, indicating that the row address has been valid for a predetermined length of time and the row/address multiplex control is asserted as indicated by assertion of the signal on the line 773. As is well known in the art, the row address used to access a particular memory location must be asserted for a certain length of time in order to insure accurate memory accesses. Thus, the row address setup timer is pre-programmed to expire after a predetermined number of clock cycles to indicate that valid row address data is present.

The row address strobe (RAS) signal has been deasserted for a sufficient time to satisfy the row address strobe (RAS) pre-charge requirements when a row address strobe (RAS) precharge timer (not shown) has expired. As is well known in the art, a certain length of time is required to pre-charge a given row within the DRAM 160 before a new row address strobe (RAS) line can be activated. Thus, a timer may be pre-programmed to count down a certain number of clock cycles between the time that pre-charge of the row begins and the time that a new address strobe (RAS) line is activated.

In like manner, each of the conditions set forth in Rules 2 and 3 for asserting the row address strobe (RAS) signal may also be reduced to signals present on the lines and busses input to the row address strobe logic 740. The specific relation of the outputs of the row address strobe logic 740 to the inputs of the row address strobe logic 740 will be discussed in greater detail below with reference to FIGS. 7–10.

Figure 6:
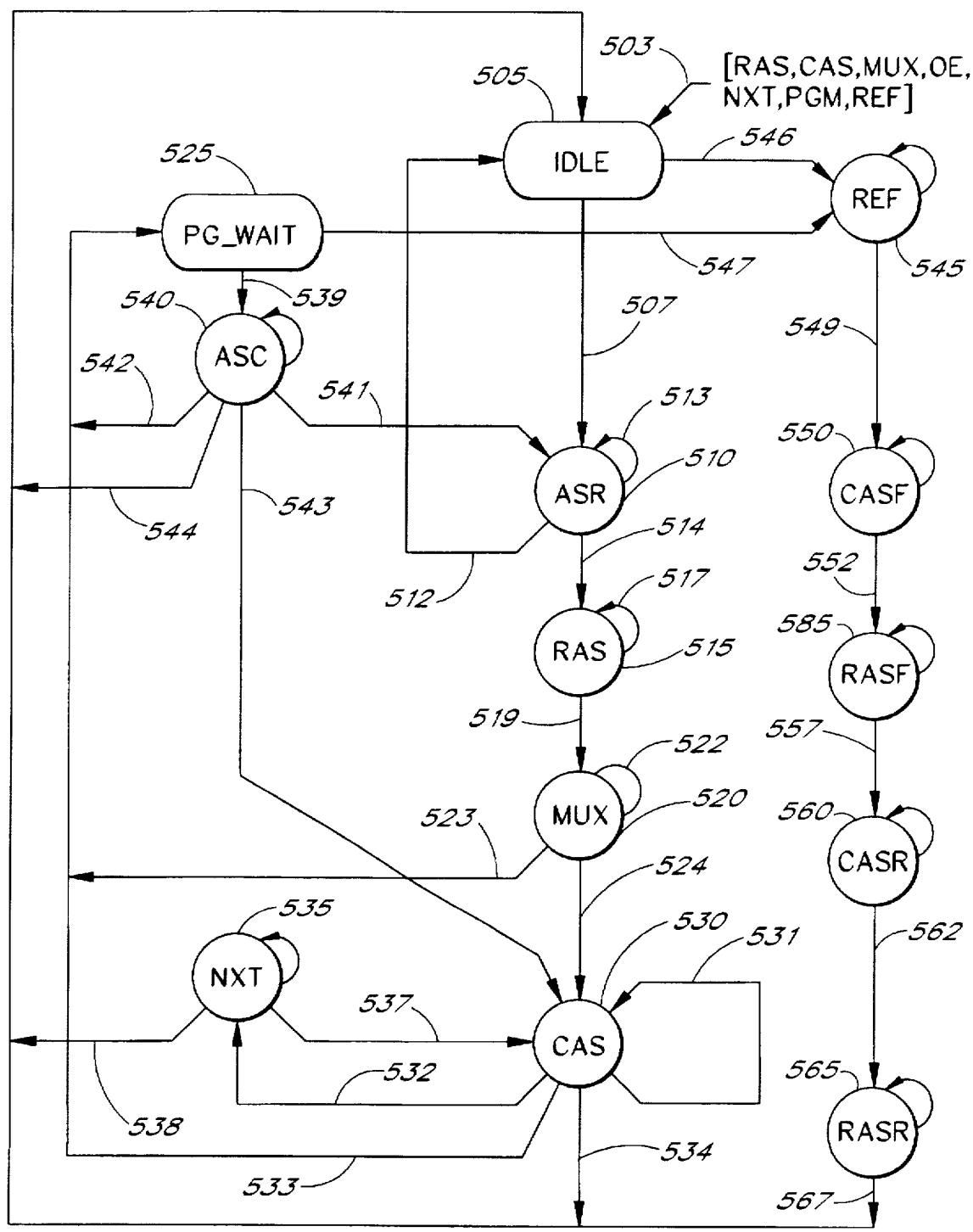
FIG. 6 is a state diagram which illustrates the flow of control associated with the DRAM sequencer of FIG. 5.
Figure 7A:
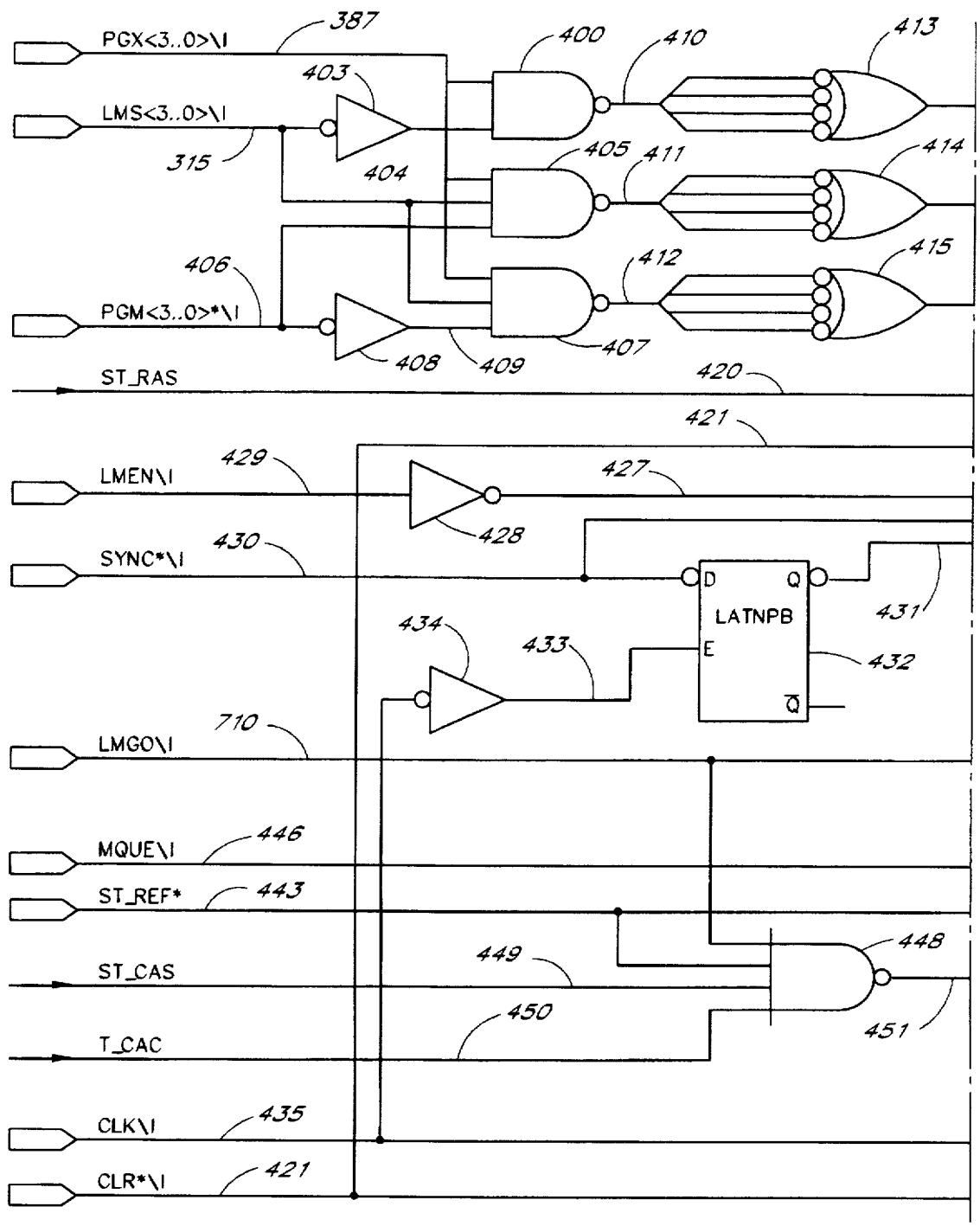
FIGS. 7A–7B, 8A–8C, 9A–9C and 10 are schematic diagrams showing the internal logic circuitry contained within the DRAM sequencer of FIGS. 4 and 5.
Figure 7B:
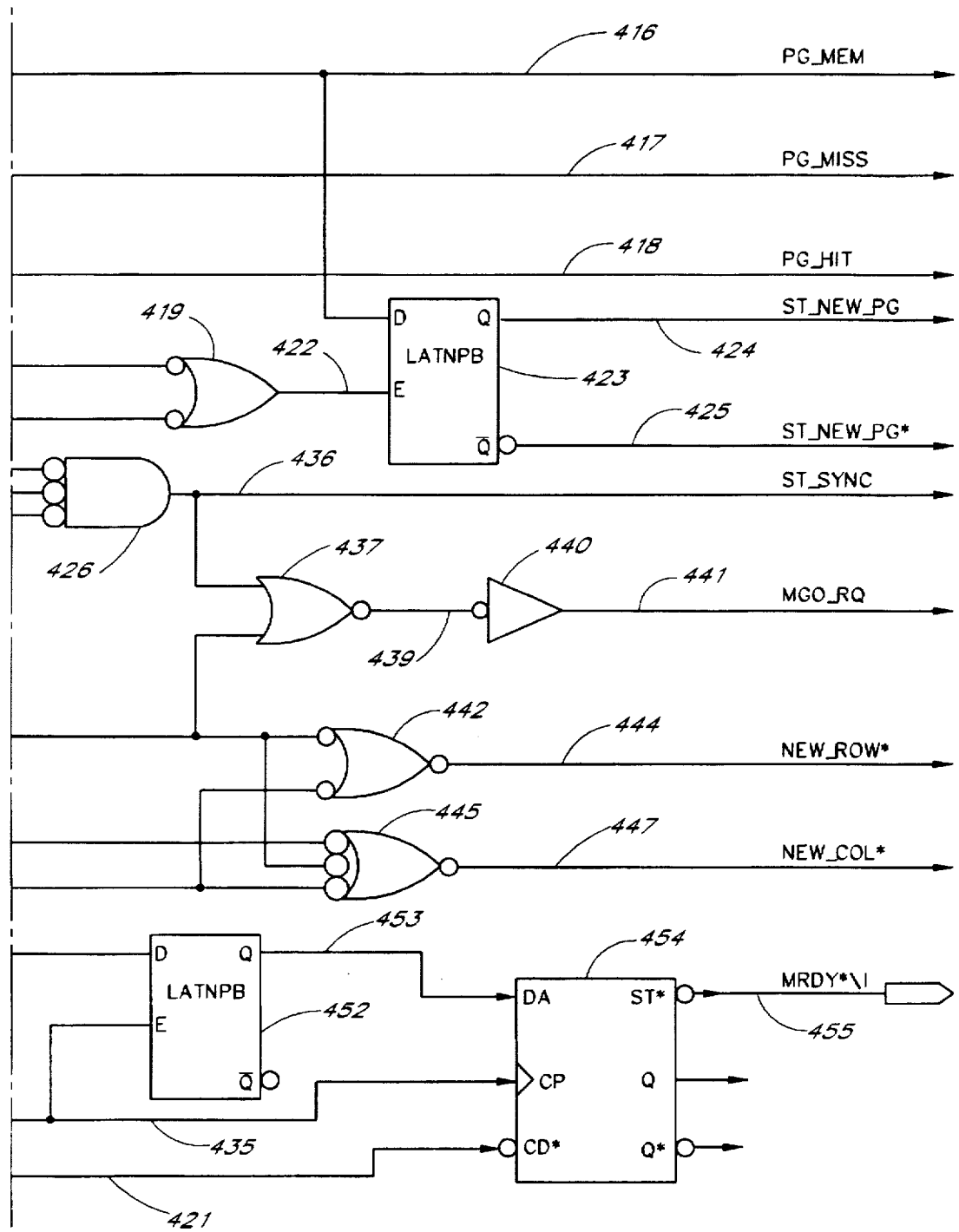

FIG. 6 is a state diagram which illustrates the flow of control associated with the DRAM sequencer of 300. As shown in FIG. 6, the DRAM sequencer circuit 300 enters an IDLE state 505 via, for example, a path 503 which is traversed from any of the states within the state flow diagram 500 of FIG. 6 upon the application of a clear signal to the DRAM sequencer 300. When the clear signal is applied to the DRAM sequencer 300 via the input line 712, each of the significant output signals driven by the DRAM sequencer 300 are deasserted. Specifically, the row address strobe (RAS) signal, the column address strobe (CAS) signal, the multiplex control signal, the write enable (WE) signal, the output enable (OE) signal, the next column signal, the page mode signal, and the refresh signal are all deasserted within the idle state 505.

Upon assertion of the local memory enable signal input via the line 706, the DRAM sequencer 300 transitions to an address setup requirements (ASR) state 510 via a transition path 507. Within the state 510, the DRAM sequencer 300 issues signals causing a specified row within the DRAM 160 to be precharged. Thus, while in the precharged state 510, the row address strobe (RAS) signal is unasserted, the column address strobe (CAS) signal is unasserted, the write enable (WE) signal and the output enable (OE) signals are also unasserted. The row address strobe signal is unasserted to precharge the row specified by the previous memory access. The DRAM sequencer 300 remains within the precharged state 510 until the appropriate signals are asserted as indicated by loop transition pass 513.

The DRAM sequencer 300 transitions from the precharged state 510 back to the idle state 505 if the local memory go (LMGO) signal (applied over the line 710) is deasserted while the DRAM sequencer 300 is within the precharged state 510. It should be understood that the assertion of the LMGO signal indicates a local memory request. Otherwise, the DRAM sequencer 300 transitions from the precharged state 510 to a row address strobe (RAS) state 515 via a path 514 when the local memory go (LMGO) signal remains asserted when an address setup requirements timer and the row access precharge timer have both expired. That is, the local memory is enabled as indicated by the assertion of the local memory go (LMGO) signal, and enough time has been allotted to meet address setup requirements as well as row access precharge requirements. Satisfaction of these requirements is indicated by the assertion of TASC and TCP signals (see FIG. 3) indicating that the address setup requirement timer and the row access precharge timer have expired. Control then passes from the address setup requirements state 510 to the row address strobe state 515.

Within the row address strobe state 515, the row address strobe (RAS) signal is asserted while the column address strobe (CAS) signal remains unasserted, the row signal remains asserted, the write enable and the output enable (OE) signals remain unasserted. Thus, while in the row address strobe state 515, the DRAM sequencer 300 causes the selected row within the DRAM 160 to be enabled. The DRAM sequencer 300 remains within the row address strobe state 515 until a row address hold timer has expired to cause a timing row address hold signal to be asserted. The row address hold timer expires when the row address strobe (RAS) signal has been asserted for a sufficient length of time to allow for accurate reading of the address on the row within the DRAM 160. When the row address hold timing signal is asserted by the row address hold timer, the DRAM sequencer 300 transitions from the row address strobe state 515 to a multiplexer control (MUX) state 520 via a state transition path 519.

Within the multiplexer control state 520, the row address strobe (RAS) signal as well as the column signal and the write enable (WE) signal are asserted while the column address strobe signal and the output enable (OE) signal are unasserted. The column signal is asserted in order to precharge a selected column at the designated memory location within the DRAM 160 while the write enable (WE) signal is asserted to transmit the data contained within the precharge column to a sense amp located at the base of the precharge column.

The DRAM sequencer 300 transitions from the multiplexer control state 520 to a page wait (PG_WAIT) state 525 via a state transition path 523 when the local memory go (LMGO) signal is deasserted. However, if the local memory go (LMGO) signal is asserted while a memory queue (MQUE) signal (indicating that the memory access is to begin) applied over the input line 722 is also asserted, and the column address setup requirements as well as the column access precharge requirements have been met, then control passes from the multiplexer state 520 to a column address strobe (CAS) state 530 via a state transition path 524. A column address setup timer is used to determine if the column address setup timing requirements have been met, and once this timer has expired a column address setup timing (TASC) signal is asserted. Likewise, a column access precharge timer is used to ensure that a sufficient length of time has elapsed to meet the column access precharge requirements, and once this column access precharge timer has expired, a column access precharge timing (TCP) signal is asserted.

Within the column address strobe state 530, the row address strobe signal, the column address strobe signal, the column signal, the write enable (WE) signal, and the output enable (OE) signal are all asserted. The assertion of the column address strobe signal together with the assertion of the output enable (OE) signal causes data within the designated address location (i.e., where the row and column intersect within the DRAM 160) to be output from the memory location onto the system bus or other data transfer device. The DRAM sequencer 300 remains within the column address strobe state 530 while the DRAM sequencer 300 waits for the DRAM data to be available on the output. This is indicated by a state transition path 531, wherein in response to the assertion of a column address hold timing (TCAH) signal, the DRAM sequencer 300 transitions from the state 530 back into the state 530. The column address hold timing signal (TCAH) is asserted when a column address hold timer has expired indicating that sufficient time has elapsed to satisfy column address hold requirements. As is well known in the art and as discussed briefly above with reference to FIG. 3, when a column address strobe signal is asserted when a valid column address is present at the input of the DRAM 160, the column address must be held (i.e., valid) for a certain time duration while the column address can be latched into address registers within the DRAM 160. This ensures accurate input of the column address.

In the event that multiple column accesses are requested from the same row and within the same page and memory bank of the DRAM 160, the local memory go (LMGO) signal is asserted as well as a column address strobe hold timing signal (TCAS) which causes the DRAM sequencer 300 to transition from the column address strobe signal state 530 to a next column (NXT) state 535 via a state transition path 532. The column address strobe hold timing signal (TCAS) is asserted when a column address strobe hold timer has expired. The column address strobe hold timer is set to expire when a sufficient time has elapsed to ensure that the column address has been latched into the DRAM 160.

When the DRAM sequencer 300 is within the next column state 535, the row address strobe (RAS) signal is asserted, the column signal is asserted and the write enable (WE) signal is asserted while the column address strobe (CAS) signal and the output enable (OE) signal are unasserted. Within the next column state 535, the DRAM sequencer 300 prepares to output data from a memory location for a new column. The next column state is primarily a delay state which insures that enough time is allotted to access the next column so that no data errors are incurred. Thus, before transition back to the column address strobe state 530, the column address setup requirements must be met, the column access precharge requirements must be met, and the local memory go (LMGO) and memory queue (MQUE) signals must be asserted. If the local memory go (LMGO) signal is asserted while the memory queue (MQUE) signal applied over the input line 722 is also asserted, and the column address setup requirements as well as the column access precharge requirements have been met, then control passes from the next column state 535 to the column address strobe state 530 via a state transition path 537. As discussed above, the column address setup timer is used to determine if the column address setup timing requirements have been met, and once this timer has expired the column address setup timing (TASC) signal is asserted. Likewise, the column access precharge timer is used to ensure that a sufficient length of time has elapsed to meet the column access precharge requirements, and once this column access precharge timer has expired, the column access precharge timing signal (TCP) is asserted.

Once the appropriate signals have been asserted, the DRAM sequencer 300 passes from the next column state 535 to the state 530 wherein data at the designated memory location is output. If the local memory go (LMGO) signal is deasserted while the DRAM sequencer 300 is in the state 535, the DRAM sequencer 300 transitions from the state 535 to the page wait state 525 via a state transition path 538.

The page wait state 525 may also be entered via a state transition path 533 from the column address strobe state 530. The DRAM sequencer 300 transitions from the column address strobe state 530 to the page wait state 525 upon the assertion of the page mode (PGMODE) signal over the input line 714 (see FIG. 5), the deassertion of the local memory go (LMGO) signal, and the assertion of the column address strobe hold timing signal (TCAS). The DRAM sequencer 300 may also transition from the column address strobe state 530 to the idle state 505 in the event that the page mode signal (PGMODE) and the local memory go (LMGO) signal are both deasserted and the column address strobe hold timing signal (TCAS) is asserted. The transition of the DRAM sequencer 300 from the state 530 to the idle state 505 indicates that both a new column and a new row have been accessed within the DRAM 160.

The page wait state 525 is a delay state entered by the DRAM sequencer 300 whenever a memory access to the same row but a different memory bank is made. Within the page wait state 525, the row address strobe (RAS) signal and the column signal are asserted while the column address strobe (CAS) signal, the write enable (WE) signal, and the output enable (OE) signal are all unasserted. Control passes from the state 525 to a column address setup (ASC) state 540 via a state transition path 539 when the local memory enable signal applied over the line 706 is asserted.

Within the column address setup state 540, the row address strobe (RAS) signal, together with the column and write enable (WE) signals, are asserted, while the column address strobe (CAS) signal and the output enable (OE) signal are unasserted. Thus, the column address setup state 540 is a transitional state wherein the DRAM sequencer 300 delays between accesses to data within different pages of memory or different memory banks altogether. If the local memory go (LMGO) signal, a page new (PGNEW) signal, indicating that a new memory bank has been accessed, and the memory queue (MQUE) signal are all asserted, while the DRAM sequencer 300 is within the state 540, control passes from the state 540 into the address setup requirement (ASR) state 510 via a state transition path 541. It should be noted here that the transition to the state 510 occurs via the states 525 and 540 rather than through the idle state 505 because of the possibility that the next memory access will not be to the same page. That is, the idle state 505 is slower to transition from in the eventuality of a memory access to a different page. If, on the other hand, the local memory go (LMGO) signal is unasserted while in the state 540, the DRAM sequencer 300 transitions from the state 540 back into the page wait state 525 via a state transition path 542. However, if the DRAM sequencer 300 is within the state 540 when the local memory go (LMGO) signal and the memory queue signal (MQUE) are asserted, together with the column address setup timing signal (TASC), and a page hit signal (PGHIT) indicating that the same page is being accessed within the memory, then control passes from the state 540 to the column address strobe state 530 via a state transition path 543. The transition from the state 540 to the state 530 indicates that the same page is being accessed within a given memory bank. It should be understood that the transition along the path 543 occurs when a memory request to the same page is first initiated, while the transition along the path 533 is taken when a memory request is being completed. Finally, if it is determined that the memory access is to a different page within the same memory bank of the DRAM 160, as indicated by the assertion of a page miss signal (PGMISS), and the local memory go (LMGO) signal is also asserted over the line 710 (see FIG. 5), then control passes from the column address setup state 540 to the idle state 505 via a state transition path 544.

The above description has detailed the general method employed in accordance with the teachings of the present invention to access the DRAM 160 using the rule based DRAM controller 220. In addition to accessing functions, however, the DRAM controller 220 must also provide refreshing functions for the DRAM 160. Thus, from the idle state 505, the DRAM sequencer 300 may transition to a refresh (REF) state 545 via a state transition path 546. The DRAM sequencer 300 transitions from the state 505 to the state 545 when the refresh request (REFRQ) signal (asserted over the line 716 in FIG. 5) is asserted and the local memory go (LMGO) signal is unasserted. The refresh state 545 may also be entered from the page wait state 525 via a state transition path 547 when the refresh request signal is asserted, the local memory go (LMGO) signal is unasserted, and a row address strobe hold timing signal (TRAS) is asserted. The row address strobe hold timing signal (TRAS) is asserted when a row address strobe hold timer expires indicating that the row address strobe signal (RAS) has been asserted for a sufficient length of time and may now be unasserted without compromising memory accesses.

Within the refresh state 545, the row address strobe (RAS) signal, the column address strobe (CAS) signal, the write enable (WE) signal, and the output enable (OE) signal are all unasserted, while the row address is asserted. As is well known in the art, memory refreshes are somewhat different in operation from memory accesses, so that the sequence of memory refreshes follows a somewhat different method outlined in the memory accesses. It will be appreciated, however, that such differences are well understood by those skilled in the art and need not be elaborated on here for purposes of illustrating the present invention. Briefly, within the refresh state 545, the row of the memory location to be refreshed is precharged until the row address strobe before column address strobe (RAS before CAS) requirements are satisfied and the local memory go (LMGO) signal is unasserted. Once the appropriate precharge requirements are satisfied and the local memory go (LMGO) signal is unasserted, the DRAM sequencer 300 transitions from the state 545 to a column address strobe refresh (CASF) state 550 via a state transition path 549.

Within the column address strobe refresh state 550, the row address strobe (RAS) signal and the write enable and output enable (OE) signals are unasserted, while the column address strobe (CAS) signal and the row address are asserted. The DRAM sequencer 300 transitions from the state 550 to a row address strobe refresh (RASF) state 585 via a state transition path 552 when a column address strobe setup for refresh timer has expired and a corresponding signal (TCSR) has been generated, indicating that a sufficient time has elapsed to allow the column address strobe (CAS) signal to reach the appropriate voltage level.

Within the row address strobe refresh state 585, the row address strobe (RAS) signal, the column address strobe (CAS) signal, and the row address are all asserted, while the write enable (WE) and output enable (OE) signals are unasserted. Thus, the memory location at the intersection of the activated row and all columns are accessed, but the data at these memory locations are not written out from the memory location so that the row memory location is merely refreshed. To ensure proper refresh, the column address strobe (CAS) signal must be asserted for a predetermined length of time. Thus, a column address strobe pre-refresh timer is programmed to expire after a sufficient length of time. Once the column address strobe hold pre-refresh timer has expired, a column address strobe hold pre-refresh timing signal (TCHR) is asserted. It should be noted here that the pre-refresh timing signal (TCHR) corresponds to the time the column address strobe (CAS) signal is held after the assertion of the row address strobe (RAS) signal in a CAS before RAS refresh cycle. This cycle is not shown in FIG. 3, but is well known to those skilled in the art. The assertion of the column address strobe hold pre-refresh timing signal (TCHR) causes the DRAM sequencer 300 to transition from the row address strobe refresh state 365 to a column address refresh clear (CASR) state 560.

Transition to the refresh clear state 560 indicates that the refresh at a given memory location is complete so that the column address strobe (CAS) signal is deasserted together with the write enable and output enable (OE) signals, while the row address strobe (RAS) signal and the row signal remain asserted. Once the row address strobe hold timing requirements have been satisfied so that the row address strobe (RAS) signal may be deasserted, the DRAM sequencer 300 transitions from the column address refresh clear state 560 to a row address strobe refresh clear (RASR) state 565 via a state transition path 562.

The row address strobe refresh clear state 565 indicates that the row address strobe (RAS) signal is now able to be deasserted so that within the state 565, the row address strobe (RAS) signal, the column address strobe (CAS) signal, the write enable (WE) signal, and the output enable (OE) signal are all unasserted while the row signal remains asserted. Once the refresh signal output from the DRAM sequencer 300 has been deasserted, control passes from the state 565 to the idle state 505 via a state transition pass 567, thereby indicating that the refresh signal has been cleared and normal memory accessing operations may be resumed.

FIGS. 7–10 together detail the internal logic circuitry contained within the DRAM sequencer 300 of FIG. 4. A bank of four two-input NAND-gates 400 (depicted for simplicity as a single two-input NAND-gate in FIG. 7A) receive respective page hit inputs via the four-line bus 387. The NAND-gates 400 further receive local memory select inputs via the four-line bus 315, a four-input, four-output inverter 403, and a four line bus 404. The four line bus 387 includes the four-bit page select signal having bits 0–3 wherein each of the bits 0–3 are applied respectively to one of the inputs of each of the four two-input NAND-gates 400. The four-line bus 315 carries the four-bit local memory select signal wherein each of the bits 0–3 are inverted in the inverter 403 and each of the inverted bits 0–3 are respectively applied to the second input of each of the four NAND-gates 400.

A bank of four three-input NAND-gates 405 (depicted in FIG. 7A as a single three-input NAND-gate for simplicity) receives inputs from the four-bit page hit bus 387, the four-bit local memory select bus 315, and the four-bit page select bus 325. The four-bit bus 325 carries bits 0–3 of the page hit signal. Each of the bits 0–3 on the buses 387, 315, 325 respectively act as inputs to the four three-input NAND-gates 405. That is, bit 0 on the line 387 acts as a first input to a first NAND-gate within the four NAND-gate battery 405 while bit 0 on the bus 315 acts as a second input to the first NAND-gate and bit 0 on the bus 325 acts as a third input to the first NAND-gate within the NAND-gate battery 405. In like fashion, bit 1 on the bus 387 serves as a first input to a second NAND-gate while bit 1 on the bus 315 acts as a second input to the second NAND-gate and bit 1 on the bus 325 acts as a third input to the second NAND-gate within the NAND-gate battery 405.

A battery of four three-input NAND-gates 407 receives first inputs from the bus 387, second inputs from the bus 315, and third inverted inputs from the bus 325 via an inverter 408 and a four-bit bus 409.

The NAND-gate batteries 400, 405, 407 provides outputs on four-bit busses 410, 411, and 412 respectively. Thus, the first NAND-gate within each four NAND-gate battery 400, 405, 407 provides a first output line on the four-bit busses 410, 411, 412, respectively, while the second NAND-gate within each of the four NAND-gate batteries 400, 405, 407 provides a second output line on the four-bit busses 410, 411, 412, respectively, etc. Thus, an inventive logic, four-input NAND-gate 413 receives an input from each of the outputs of the four NAND-gates within the battery 400 while an inverted logic four-input OR-gate 414 receives inputs from the outputs of each of the NAND-gates contained within the four NAND-gate battery 405, and a four-input inverted logic OR-gate 415 receives the respective outputs of the four NAND-gates within the four NAND-gate battery 407. Each of the inverted logic OR-gates 413, 414, 415 provides single bit outputs over lines 416, 417, 418, respectively, which are active high when any respective input is active low. As used herein, an "inverted logic" gate is one where the active input is a low signal. Thus, an inverted logic OR-gate will provide an active output when any input is low.

The output provided on line 416 is the page new output, which indicates that the current memory access is to a new page of memory within the DRAM 160. The output provided on the line 417 is the page miss output, which indicates that the current memory access is to another page of memory than the last memory access within the DRAM 160, and the output provided on the line 418 is the page hit output indicating that the current memory access is to a memory location which is in the same page of memory as the last memory access.

A two-input inverted logic OR-gate 419 receives a first input on a feedback line 420 carrying an active low RAS state (STRAS) signal indicating whether the row address strobe (RAS) signal is being asserted. A second input line 712 carrying an active low clear signal serves as a second input to the OR-gate 419. An output 422 of the OR-gate 419 serves as an enable input to a D-flip-flop 423. The D-flip-flop 423 includes an active high output 424 and a corresponding active low output 425, each of which carry new-page state (STNEWPG) signals indicating whether a new page is being accessed within the DRAM 160. The D-input of the D-flip-flop 423 is provided from the line 416.

A three-input inverted logic AND-gate 426 receives a first input over a line 427 which is an output to an inverter 428 receiving an input from the line 706. The line 706 carries the local memory enable (LMEN) signal which indicates whether the local memory has been enabled. A second input of the AND-gate 426 is provided via a line 708 which carries a synchronization signal which is asserted when the system bus clock is synchronized with the DRAM internal clock. A third input of the AND-gate 426 is provided via a line 431 which is an output of a D-flip-flop 432. The D-flip-flop 432 receives an inverted input signal from the line 708 as well as an enable signal via a line 433 which is the output of an inverter 434 receiving input from a system clock signal over a line 720. The output of the AND-gate 426 is provided on a line 436 which carries a state-synchronization signal which is pulsed at the same rate as the DRAM internal clock and indicates when the system bus clock is synchronized with the DRAM internal clock.

A NOR-gate 437 receives a first input via the line 436 and a second input via a line 710 which carries the local memory go (LMGO) signal indicating that the local memory is being accessed. An output 439 of the NOR-gate 437 serves as an input to an inverter 440 which in turn outputs a memory access request signal (MGORQ) over a line 441. The memory access request signal (MGORQ) signal on the line 441 is pulsed at a rate which is consistent with the DRAM internal clock and indicates that a data read or a data write to the local memory is about to take place.

An inverted logic two-input NOR-gate 442 (i.e., any low input causes a low output) receives a first input via the line 710 and a second input via a line 443 which carries an active low refresh state (STREF) feedback signal indicating whether the DRAM 160 is being refreshed. The output of the NOR-gate 442 is provided over a line 444 which carries a new-row (NEWROW) signal indicating that a new row address is being requested. A new row address may be requested when a clear due to refreshing or due to a new memory access is initiated. A three-input inverted logic NOR-gate 445 receives a first input via a line 722 which carries the memory access queued (MQUE) signal, indicating that a memory address which is held within an address queue is being strobed into the DRAM 160. The NOR-gate 445 receives a second input via the line 710, and a third input via the line 443. An output of the NOR-gate 445 is provided over a line 447 which carries a new column address request (NEWCOL) signal indicating that the DRAM controller 220 is requesting a new column address.

A NAND-gate 448 receives four inputs. A first input of the NAND-gate 448 receives the LMGO/I signal via the line 710, a second input is provided by the line 443, a third input is provided by a line 449 which carries a column address strobe state (STCAS) signal indicating whether or not the CAS signal is asserted. A fourth input is provided to the NAND-gate 448 via a line 450 which carries a column access cycle timing (TCAC) signal indicating whether enough time has elapsed to latch data from the columns to the output buffers (not shown) of the DRAM 160. Thus, the assertion of the TCAC signal indicates that the output buffers of the DRAM 160 are available to be read. An output 451 of the NAND-gate 448 serves as a D-input to a D-flip-flop 452. The D-flip-flop 452 receives an enable input via the clock line 720 and provides an output to a data input of a pulse trigger circuit 454. The pulse trigger circuit 454 receives a clock input via the clock line 720 and a clear input via the line 712. The circuit 454 provides a memory ready (MRDY) signal as an output over a line 455 which indicates that the data is ready for transfer out of the DRAM output buffers.

Figures 8, 8A:
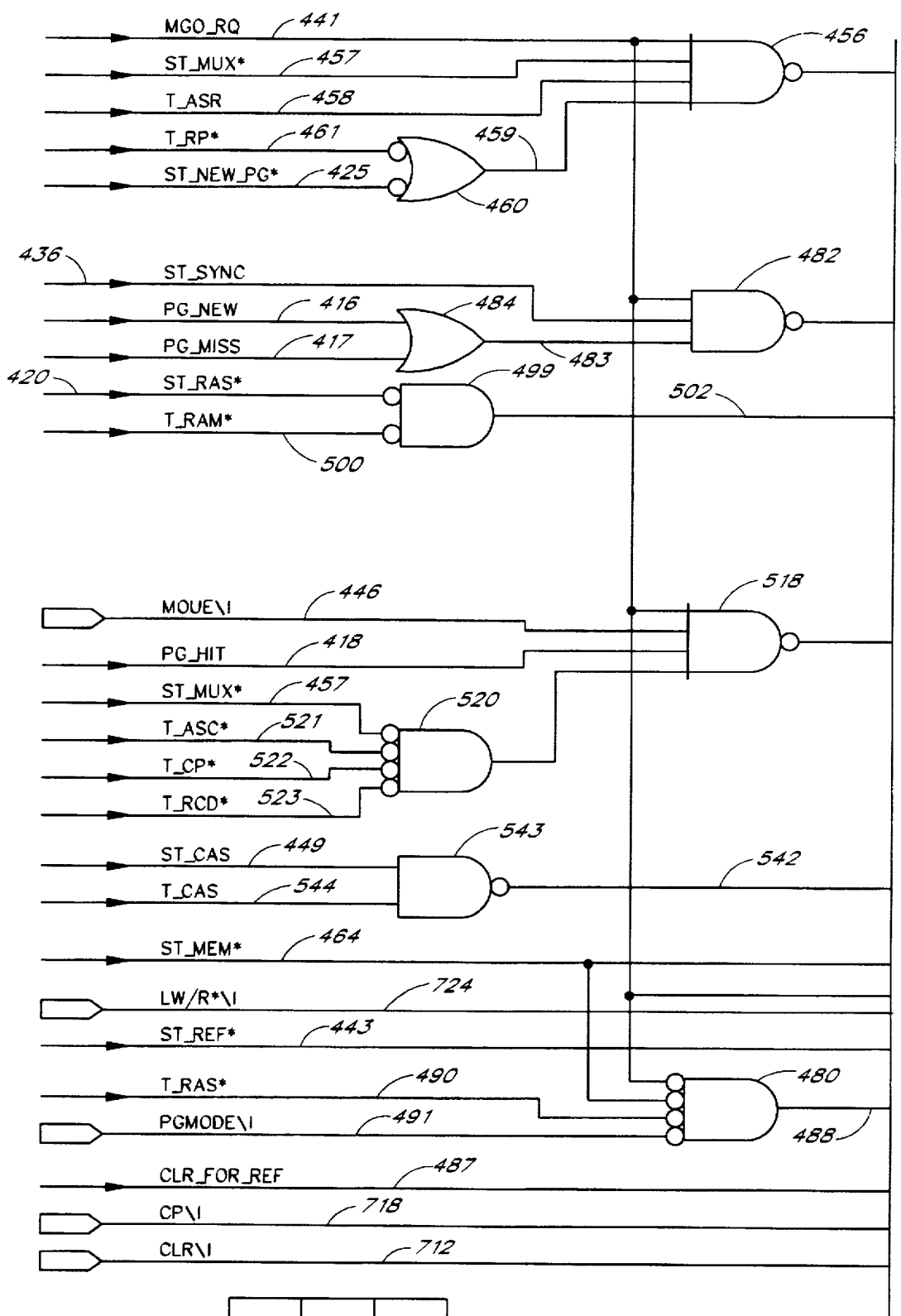
Figure 8B:
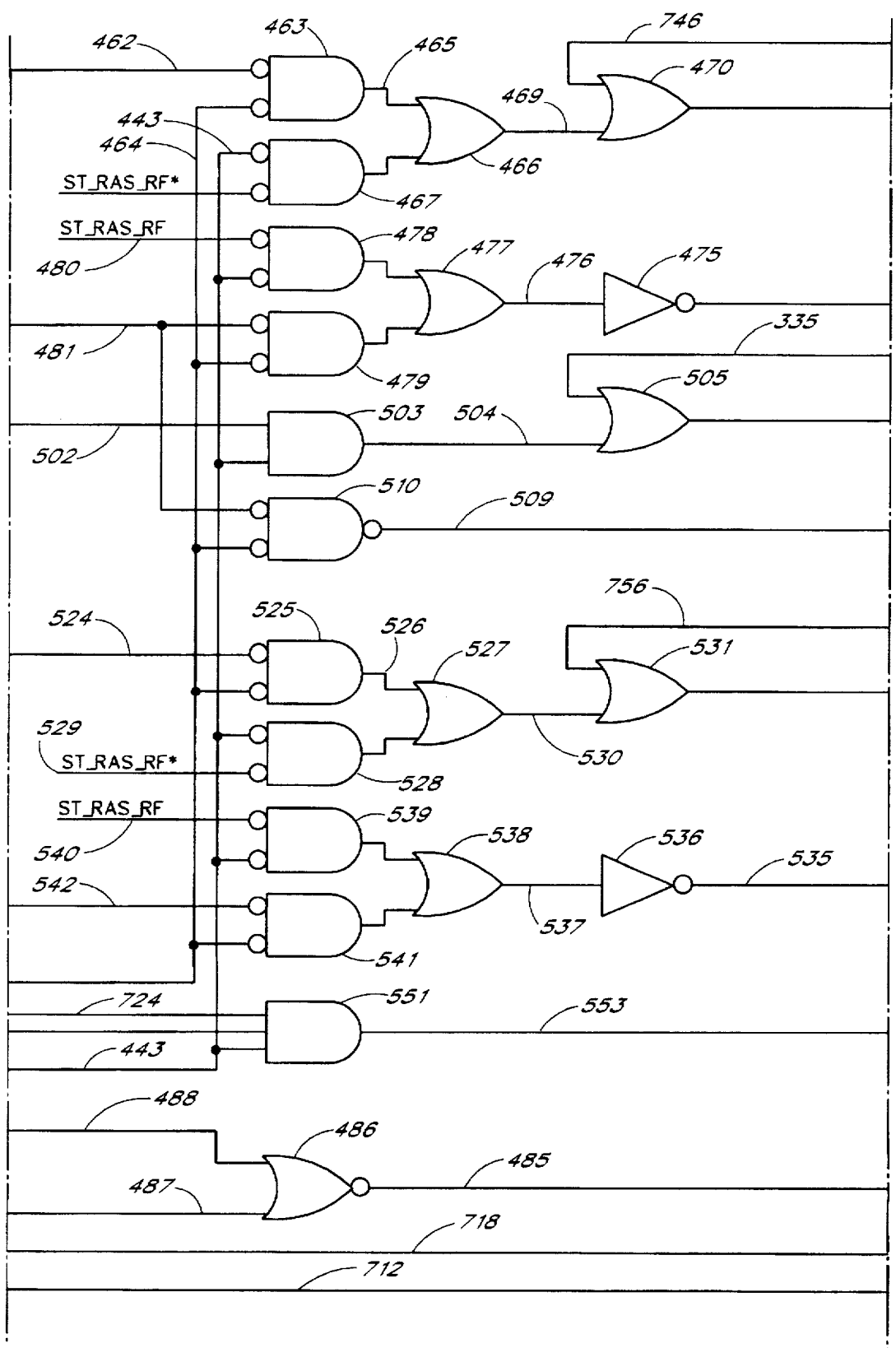
Figure 8C:
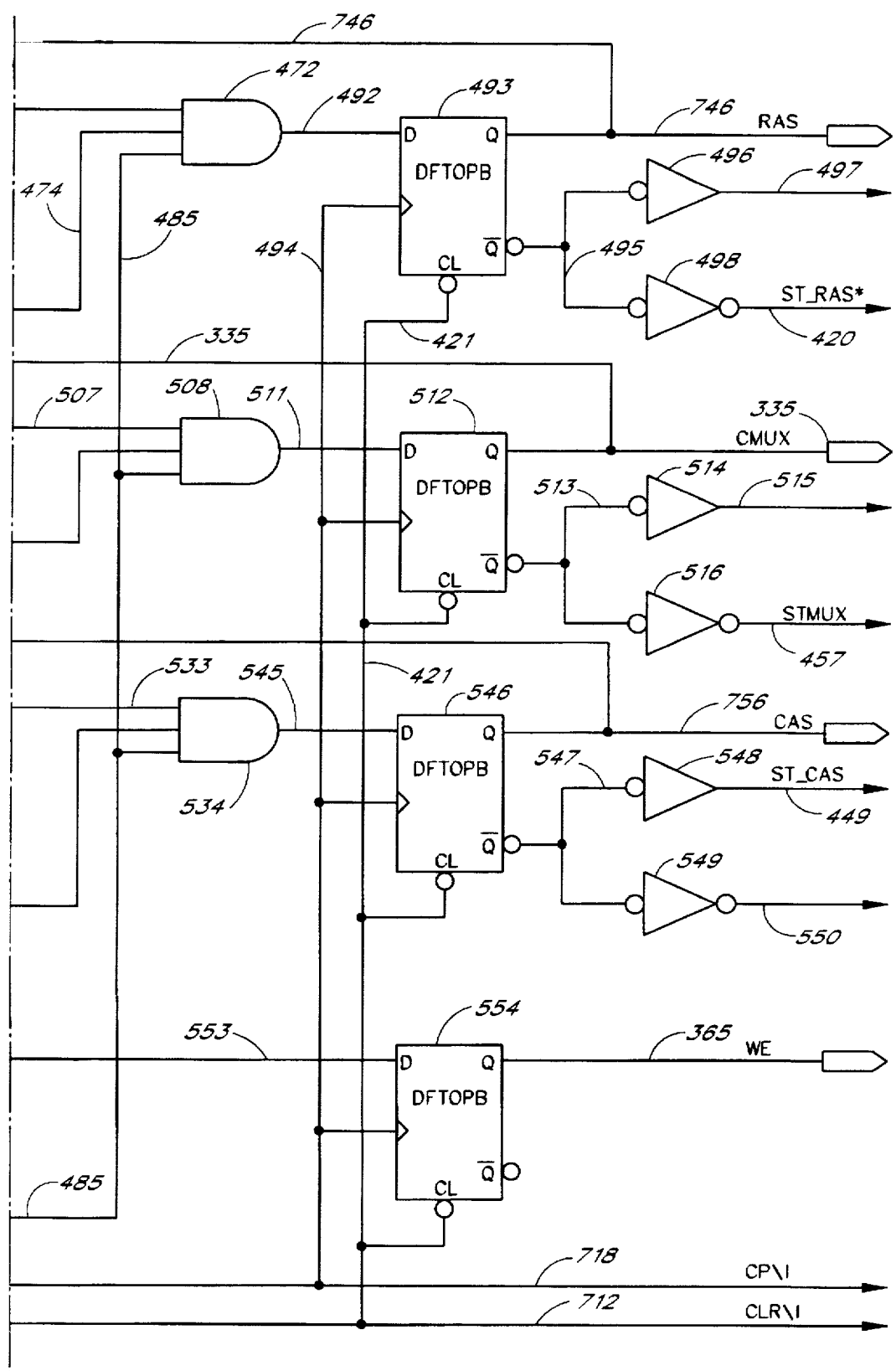

Reference is now made to FIG. 8 wherein a four-input NAND-gate 456 receives a first input via the feedback line 441 which carries the memory access request (MGORQ) signal. The four-input NAND-gate 456 further receives second and third inputs via lines 457, 458, which respectively carry a multiplexer state (STMUX) signal and a row address setup timing (TASR) signal. The STMUX signal indicates whether the multiplexer control signal on the line 335 is asserted, while the TASR signal is asserted when it is okay to assert the row address strobe (RAS) signal after the row address data is valid at the input of the DRAM 160 (see $t_{ASR}$ in FIG. 3). Finally, the NAND-gate 456 receives a fourth input via a line 459 which serves as an output from a two-input inverted logic OR-gate 460. The OR-gate 460 receives a first input via a line 461, which carries a row precharged timing (TRP) signal indicating whether enough time has elapsed to pre-charge a new row which is to be accessed (see $t_{RP}$ in FIG. 3). A second input of the OR-gate 460 is provided by the line 425. It should be noted that each of the signals on the lines 441, 457, 458, 461, and 425 are feedback signals within the DRAM control sequencer logic.

The output of the NAND-gate 456 is carried upon a line 462 which serves as a first input to an inverted logic AND-gate 463. An input line 464 provides a memory state (STMEM) signal, which is asserted when the DRAM 160 is accessible. The line 464 serves as a second input to the AND-gate 463.

An output line 465 from the AND-gate 463 serves as a first input to an OR-gate 466. A second input to the OR-gate 466 is provided from an inverted logic AND-gate 467. The AND-gate 467 receives the line 443 as a first input and a line 468 as a second input. The line 443 carries the refresh state (STREF) signal, while the line 468 carries an active low RAS refresh state (STRASREF) signal, indicating whether the RAS refresh cycle is active. An output of the OR-gate 466 is provided on a line 469 to a first input of an OR-gate 470. The OR-gate 470 further receives a feedback signal via a line 746. The line 746 carries the row address strobe signal which is to be output from the DRAM control sequencer logic 300. The output of the OR-gate 470 is provided as a first input to an AND-gate 472 via a line 473. The AND-gate 472 further receives a second input via a line 474, which is the output of an inverter 475 having an input line 476. The input line 476 serves as the output to an OR-gate 477 having inputs from invertor logic AND-gates 478, 479, respectively. The AND-gates 478, 479 together with the OR-gate 477 act in substantially the same way as the AND-gates 463, 467 and the OR-gate 466 described above, with the exception that the AND-gate 478 receives a first input via a line 480 carrying an active high RAS refresh state (STRASREF) signal which is the conjugate to the signal carried upon the line 468 of the AND-gate 467. Furthermore, the AND-gate 479 receives a first input via a line 481 which serves as the output from a NAND-gate 482. The NAND-gate 482 receives a first input via the line 441 and a second input via the line 436 carrying the synchronization state (STSYNC) signal. The third input of the three-input NAND-gate 482 is provided via a line 483 from the output of an OR-gate 484. The OR-gate 484 receives inputs from the lines 416, 417, which respectively carry the page new (PGNEW) signal and the page miss (PGMISS) signal.

The three-input AND-gate 472 further receives a third input via a line 485 which serves as the output from a two-input NOR-gate 486. The NOR-gate 486 receives a clear for refresh (CLRFORREF) signal which is asserted via line 487 to request if the refresh cycle may be initiated. A second input to the NOR-gate 486 is provided via a line 488. The line 488 serves as an output from a four-input inverter logic AND-gate 489. The AND-gate 489 receives a first input via the line 441, a second input via the line 464, a third input via the line 490, and a fourth input via the line 714. The line 490 carries the row address strobe hold timing (TRAS) signal, which is asserted when a row address strobe hold timer expires indicating that the row address strobe signal (RAS) has been asserted for a sufficient length of time and may now be unasserted without compromising memory accesses. The line 714 carries the page mode (PGMODE) input signal, which, as discussed above, is asserted when the DRAM is configured so that substantial accessing time is saved during accesses to data in the same row.

The three-input AND-gate 472 which receives inputs via the lines 473, 474, 485 provides an output to the data input of a D-flip-flop 493 via a line 492. The D-flip-flop 493 receives the signal CP\I as a clock input via a line 718 and recognizes the signal CLR\I a clear input via the line 712. The output of the D-flip-flop 493 is provided as the row address strobe signal on the line 746, while a conjugate to the row address strobe signal is provided as an output on a line 495 which serves as an input to an inverting buffer 496 having an output 497 and a non-inverting buffer 498 which provides the active low RAS state output signal on the line 420.

Thus, the logic gates 456-498 serve as control logic which determine the rules for asserting the row address strobe signal.

An inverted negative logic two-input AND-gate 499 receives a first input via the line 420 which carries the RAS state (STRAS) signal and a second input via a line 500 which carries a row address hold timing (TRAH) signal indicating that the row address which is valid at the input of the DRAM 160 can be deasserted (since sufficient time has elapsed to latch in the row address after the assertion of the RAS signal). The output of the AND-gate 499 is provided via a line 502 as a first input to an AND-gate 503. The AND-gate 503 further receives a second input via the line 443 and provides an output via a line 504. The line 504 serves as a first input to an OR-gate 505 which receives a second feedback input via a line 335. The line 335 carries the multiplex control signal (CMUX), which is also provided as an output of the DRAM control sequencer logic 300 to the memory address driver circuit 330 via the line 335.

An output 507 of the OR-gate 505 serves as a first input to a three-input AND-gate 508. The three-input AND-gate 508 further receives a second input via a line 509 which serves as an output of an inverted logic NAND-gate 510. The NAND-gate 510 receives a first input via the line 481 (i.e., the output of the NAND-gate 482) and a second input via the line 464, which carries the memory state (STMEM) signal. The third input of the AND-gate 508 is provided via the line 485. An output 511 of the AND-gate 508 serves as a data input to a D-flip-flop 512 having a clock input that receives the signal CLR\I via the line 718 and a clear input via the line 712. The output of the D-flip-flop 512 is the multiplex control (CMUX) signal which is carried over the line 335.

The conjugate of the multiplex control (CMUX) signal is provided as an inverted output of the D-flip-flop 512 via a line 513. The line 513 serves as an input to an inverter 514 having an output 515, as well as a non-inverting buffer 516 which provides an active low multiplex state (STMUX) signal over the line 457. Thus, the logic elements 499-516 act to implement the rules by which conditions provided as input signals result in the assertion of the multiplex control (CMUX) signal over line 335 provided as an output signal.

The logic circuit which is used to generate the column address strobe (CAS) signal output from the DRAM control sequencer logic 300 is substantially similar to the logic used to generate the row address strobe (RAS) signal within the DRAM control sequencer logic 300. Specifically, a four-input NAND-gate 518 receives a first input via the line 441, a second input via the line 722, a third input via the line 418, and a fourth input via the line 519. The line 519 serves as the output of a four-input inverted logic AND-gate 520 having a first input provided via the line 457 which carries the multiplex state (STMUX) signal. A second input to the AND-gate 520 is provided via a line 521 which carries a column address setup timing (TASC) signal indicating that sufficient time has elapsed since the column address has been valid to allow for the assertion of the CAS signal (see $t_{ASC}$ in FIG. 3). A third input to the AND-gate 520 is provided via a line 522 which carries a column precharge timing (TCP) signal indicating that a sufficient time has elapsed to allow for pre-charging of a newly accessed column (see $t_{CP}$ in FIG. 3). A fourth input to the AND-gate 520 is provided via a line 523 which carries a row-column delay timing (TRCD) signal indicating that enough time has elapsed to access a successive column in the same row as the previous column address.

The output of the NAND-gate 518 is provided via a line 524 to a first input of an inverted logic AND-gate 525. A second input of the AND-gate 525 is provided via the line 464. An output 526 of the AND-gate 525 serves as a first input to an OR-gate 527. The OR-gate 527 receives a second input from the output of an inverted logic AND-gate 528 having a first input connected to the line 443 and a second input connected to a line 529 which carries an active low CAS refresh state (STCASREF) signal indicating whether or not a CAS refresh cycle is active. The output of the OR-gate 527 is provided via an output line 530 as a first input to an OR-gate 531. The OR-gate 531 further receives a second feedback input via a line 756. The line 756 carries a column address strobe signal (CAS) which is output from the DRAM control sequencer logic 300. An output 533 of the OR-gate 531 serves a first input to a three-input AND-gate 534. The three-input AND-gate 534 receives a second input via a line 535, which in turn is provided as the output of an inverter 536 having an input 537. The line 537 serves as the output of a two-input OR-gate 538 having a first input from an inverted logic AND-gate 539 and a second input from an inverted logic AND-gate 541. The two-input OR-gate 538 together with the AND-gates 539, 541 operate in substantially the same manner as the OR-gate 527 together with the AND-gates 525, 528.

The AND-gate 539 receives a first input via a line 540 which carries an active high refresh state (STCASREF) signal. This signal is the conjugate of the signal carried upon the line 529 which serves as the input to the AND-gate 528. A second input of the AND-gate 539 is the ST_REF* signal provided via the line 443. A first input of the AND-gate 541 is provided via a line 542 which serves as the output from a two-input NAND-gate 543. The NAND-gate 543 receives a first input via the line 449 carrying the CAS state (STCAS) signal and a second input via a line 544 which carries a column address strobe hold timing (TCAS) signal indicating that the CAS signal has been held long enough after the column address has become valid at the input of the DRAM 160 to latch the column address into the DRAM registers (see $t_{CAS}$ in FIG. 3). The second input of the AND-gate 541 is provided via the line 464 which carries the memory state (STMEM) signal. The AND-gate 534 receives a third input via the line 485. An output 545 of the AND-gate 534 serves as a data input to a D-flip-flop 546. The D-flip-flop 546 provides the column address strobe (CAS) signal as an output via the line 756. Clock and clear input signals are provided to the D-flip-flop 546 via the lines 718 and 712, respectively. An inverting output 547 provides the conjugate of the column address strobe signal as an input to an inverting buffer 548 having the ST-CAS signal line 449 as an output and an input to a non-inverting buffer 549 having a line 550 as an output. Thus, the logic elements 518–549 serve to implement the rules by which input signals via the busses 315, 325, 387, and the lines 706–722 (FIG. 5) serve as conditions used to determine the column address strobe signal output over the line 756.

The write enable (WE) signal provided as an output from the DRAM control sequencer logic 300 on the line 365 is generated in the following manner. A three-input AND-gate 551 receives the MGO_RQ signal a first input via the line 441 and receives a second input via a line 724. The line 724 carries the local write/read (LW/R*\I)signal which is asserted to indicate that the current memory access is a memory write and is left unasserted if the current memory access is a memory read. A third input of the AND-gate 551 is the ST_REF* signal provided via the line 443. The output of the AND-gate 551 is provided via a line 553 as a data input to a D-flip-flop 554. The D-flip-flop 554 receives a clock input via the line 718 and a clear input via the line 712. The write enable (WE) signal is output from the D-flip-flop 554 via the line 365.

Figures 9, 9A:
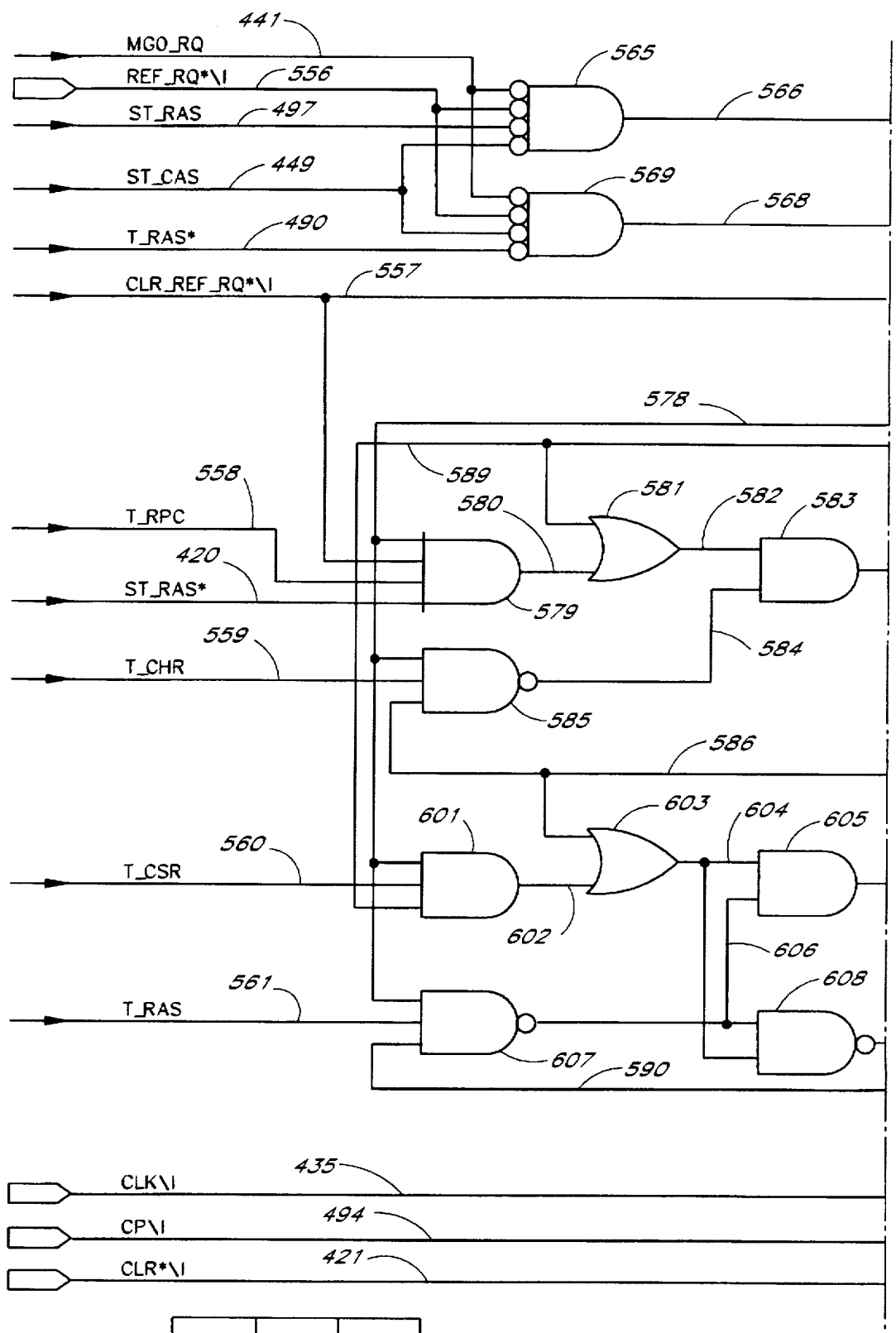
Figure 9B:
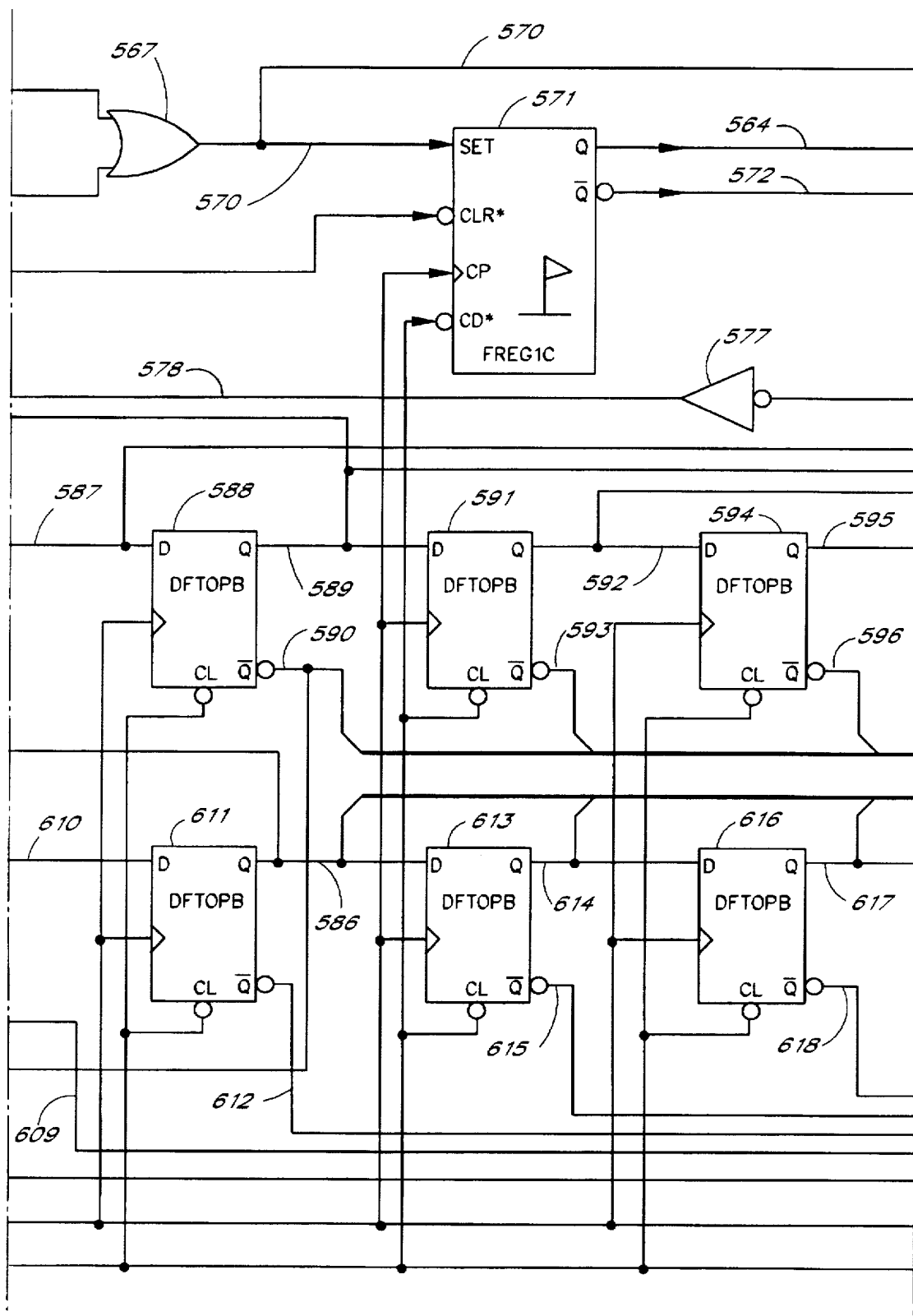
Figure 9C:
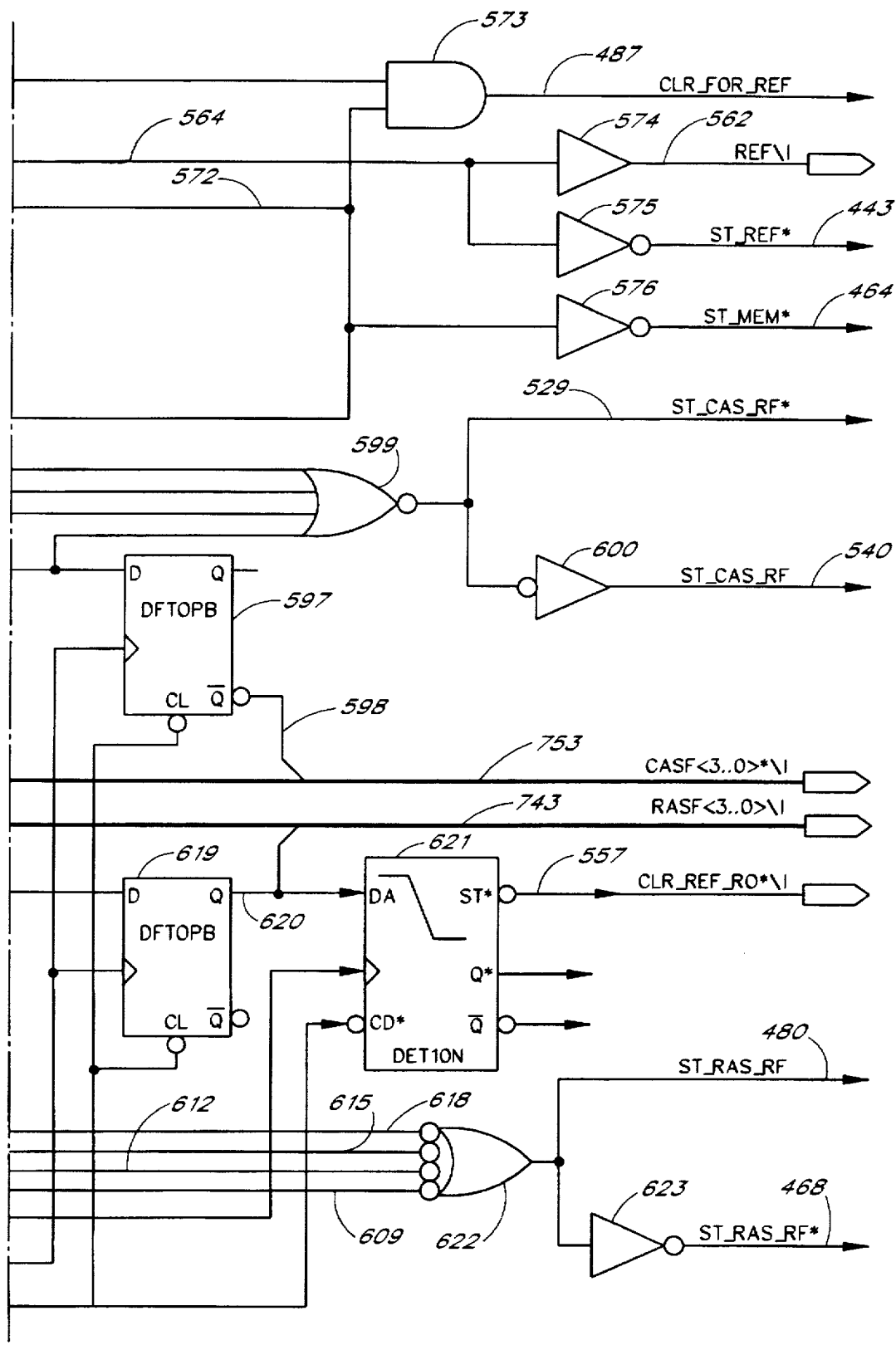

FIG. 9 depicts logic circuitry necessary to generate the refresh output signals, the CASF and RASF signals, and the clear reference request signal. As shown in FIG. 7C, a four-input inverted logic AND-gate 565 receives a first MGO_RQ signal input via the line 441; receives a second input via a line 716 which carries the refresh request (REFRQ) signal indicating that the DRAM controller 220 is requested to initiate a refresh cycle; receives a third input via the line 497, and receives a fourth input via the line 449. The lines 497 and 449 carry the row address strobe state (ST_RAS) signal and the column address strobe state (ST_CAS) signal, respectively. The AND-gate 565 provides a first input to an OR-gate 567 via a line 566. A second input to the OR-gate 567 is provided via a line 568 which serves as the output of an inverted logic four-input AND-gate 569. The AND-gate 569 receives the MGO_RQ signal as a first input via the line 441; receives the REFRQ signal as a second input via the line 716; receives the ST_CAS signal as a third input via the line 449, and receives the TRAS signal as a fourth input via the line 490.

The output of the OR-gate 567 is provided via a line 570 as the set input to a status/flag register circuit 571 which sets output logic high on the line 564 when triggered via the set input on the line 570. The status/flag register circuit 571 receives a clear input via a line 557, a clock input via the line 718, and an asynchronous reset input via the line 712. The status/flag register circuit 571 provides an inverted output via a line 572. The line 572 serves as a first input to a two-input AND-gate 573 which receives a second input via the line 570. The output of the AND-gate 573 is the clear for refresh (CLRFORREF) signal output over the line 487. The inverted output of the status/flag register circuit 571 provided over the line 572 also serves as inputs to an inverter 576 having the active low memory state (STMEM) signal as an output over the line 464. The signal on the line 572 is also provided to the input of an inverter 577 having an output line 578. A non-inverting output of the status/flag register circuit 571 on a line 564 serves as an input to a non-inverting buffer 574 having a line 562 as an output. The line 562 carries the refresh (REF\I) signal which is provided as output from the DRAM sequencer refresher logic contained within the DRAM sequencer controller logic 300. Furthermore, the non-inverting output of the status/flag register circuit 571 serves as an input to an inverting buffer 575, which provides the refresh state (STREF) signal on the line 443.

A four-input AND-gate 579 receives a first input via the line 578 and receives a second input via the line 557. A third input to the AND-gate 579 is provided via a line 558 which carries a row pre-charging timing (TRPC) signal which indicates when the row to be accessed is done pre-charging. A fourth input to the AND-gate 579 is provided via the line 420 which carries the RAS state (STRAS) signal. An output 580 of the AND-gate 579 serves as a first input to an OR-gate 581 having a second input provided as feedback via a line 589. An output 582 of the OR-gate 581 serves as a first input to a two-input AND-gate 583. A second input to the AND-gate 583 is provided via a line 584 which is the output of a three-input NAND-gate 585.

The three-input NAND-gate 585 receives a first input via the line 578, and receives a second input via a line 559. The line 559 carries a hold CAS until RAS timing (TCHR) signal indicating that the CAS signal has been asserted for a sufficient time duration after the assertion of the RAS signal. A third input is provided to the NAND-gate 585 via a line 586 which is a feedback signal. The output of the two-input AND-gate 583 is provided via a line 587 to a data input of a D-flip-flop 588. The D-flip-flop 588 receives a clock signal via the line 718 and a clear signal via the line 712. An output of the D-flip-flop 588 is provided via the feedback line 589, which is fed back to the second input of the OR-gate 581. An inverting output of the D-flip-flop 588 is provided over a line 590 to serve as one bit of a four-bit output bus 753 which carries the four-bit column address strobe refresh (CASF) signal indicating that a refresh is being asserted for a column in one of the four memory banks. The output 589 of the D-flip-flop 588 serves as a data input to a D-flip-flop 591. The D-flip-flop 591 receives clock and clear signals via the lines 718 and 712, respectively. An output of the D-flip-flop 591 is provided via a line 592. An inverting output of the D-flip-flop 591 is provided via a line 593 which serves as a second bit of the four-bit column address strobe refresh (CASF) signal carried by the signal bus 753. The output 592 of the D-flip-flop 591 serves as a data input to a D-flip-flop 594 having clock and clear signals provided via the lines 718 and 712, respectively. An output of the D-flip-flop 594 is provided over a line 595, while an inverting output of the D-flip-flop 594 is provided via a line 596. The line 596 serves to provide a third bit of the four-bit column address strobe refresh (CASF) signal provided over the signal bus 753. The output of the D-flip-flop 594 provided over the line 595 serves as a data input to a D-flip-flop 597. The D-flip-flop 597 receives a clock signal via the line 718 and a clear signal via the line 712 and provides an inverted output signal via a line 598. The line 598 provides a fourth bit of the four-bit column address strobe refresh (CASF) signal provided over the signal bus 753. The input lines 587, 589, 592, and 595 to the D-flip-flops 588, 591, 594, and 597, respectively, serve as inputs to a four-input NOR-gate 599. The four-input NOR-gate 599 provides the state-CAS refresh (STCASREF) signal as an output over the line 529 and also provides the conjugate of the signal on a line 540 via an inverting buffer 600.

The logic circuitry used to generate the four-bit row address strobe refresh (RASF) signal over the signal bus 743 is substantially similar to the circuitry used to generate the four-bit column address strobe refresh (CASF) signal via the signal bus 753. A three-input AND-gate 601 receives a first input via the line 578. The AND-gate 601 receives a second input via a line 560 which carries a setup CAS before RAS timing (TCSR) signal indicating that enough time has elapsed since the assertion of the CAS signal to assert the RAS signal. A third input is provided to the AND-gate 601 via the line 589. An output of the three-input AND-gate 601 is provided via a line 602 as a first input to a two-input OR-gate 603. The OR-gate 603 receives a second input which is the feedback signal on the line 586. An output 604 of the OR-gate 603 serves as a first input to a two-input AND-gate 605. The AND-gate 605 further receives a second input via a line 606 which serves as an output of a NAND-gate 607. The three-input NAND-gate 607 receives a first input via the line 578. The NAND-gate 607 receives a second input via a line 561 which carries the row address strobe hold timing (TRAS) signal indicating that the RAS signal has been asserted for a sufficient period of time. The NAND-gate 607 receives a third input via the line 590 which carries the conjugate of the signal provided on the line 589.

A two-input NAND-gate 608 also receives inputs via the line 606 and the line 604, as does the AND-gate 605. The output of the two-input NAND-gate 608 is provided via a line 609. The output of the two-input AND-gate 605 is provided via a line 610 as a data input to a D-flip-flop 611.

The D-flip-flop 611 receives a clock input via the line 718 and a clear input via the line 712. An output of the D-flip-flop 611 is provided over the line 586 which is fed back to both the OR-gate 603 and the NAND-gate 585. The output provided over the line 586 also serves as a first bit of the four-bit row address strobe refresh (RASF) signal provided on the signal bus 743. A conjugate or inverted output of the D-flip-flop 611 is provided via an output line 612. The output of the D-flip-flop 611 provided over the line 586 serves as an input to a D-flip-flop 613.

The D-flip-flop 613 receives a clock input via the line 718 and a clear input via the line 712. The D-flip-flop 613 further provides a non-inverting output via a line 614 and an inverting output via a line 615. The non-inverting output provided via the line 614 serves as the second bit of the four-bit row address strobe refresh (RASF) signal provided on the signal bus 743, and also serves as a data input to a D-flip-flop 616.

The D-flip-flop 616 receives a clock input via the line 718 and a clear input via the line 712 and provides a non-inverting output via a line 617 and an inverting output via a line 618. The non-inverting output of the D-flip-flop 616 serves as the third bit of the four-bit row address strobe refresh (RASF) signal carried on the signal bus 743 and also serves as a data input to a D-flip-flop 619.

The D-flip-flop 619 receives a clock signal via the line 718 and a clear signal via the line 712, and further provides a non-inverting output via a line 620. The output over the line 620 serves as the fourth bit of the four-bit row address strobe refresh (RASF) signal carried on the signal bus 743 and also serves as an input to a falling-edge detector circuit 621. The falling-edge detector circuit 621 acts to generate a pulse whenever the DA input on the line 620 transitions from high to low logic. The falling-edge detector circuit 621 receives a clock input via the line 720 and also receives a clear signal via the line 712. The output of the falling-edge detector circuit 621 serves as the clear refresh request (CLRREFRQ) signal provided over the line 557, which is output from the DRAM sequencer control logic 300 to the DRAM 160 to indicate that the refresh cycle is terminated.

A four-input inverted logic OR-gate 622 receives inputs from the inverting outputs of the NAND-gate 608 and the D-flip-flops 611, 613, and 616, on the lines 609, 612, 615, and 618, respectively. The output of the NAND-gate 622 provides the RAS refresh state (STRASREF) signal on the line 480 and the conjugate of the RAS refresh state (STRASREF*) signal on the line 468 via an inverting buffer 623.

Thus, as described above, the rule-based DRAM controller 220 implements the rules for controlling the timing and sequence of memory access and control signals to the DRAM 160 in logic. Such rule-based control provides for optimum performance of the DRAM 160. This is because the earliest possible assertion time is always chosen for a given signal, thereby minimizing DRAM accessing time and maximizing DRAM speed. The earliest possible assertion time is always chosen for a given signal because all of the conditions under which the memory accessing signals may be asserted are monitored by the DRAM controller 220. If any one of the conditions is met (i.e., if the minimum, or sufficient condition is met), then the signal will be asserted. This is in contrast to previous DRAM controllers which typically were programmed to assume a worst case scenario where the DRAM controller asserts a signal based upon conditions resulting in the longest possible delay to preclude the possibility of signals being asserted too early or out of sequence.

Figure 10:
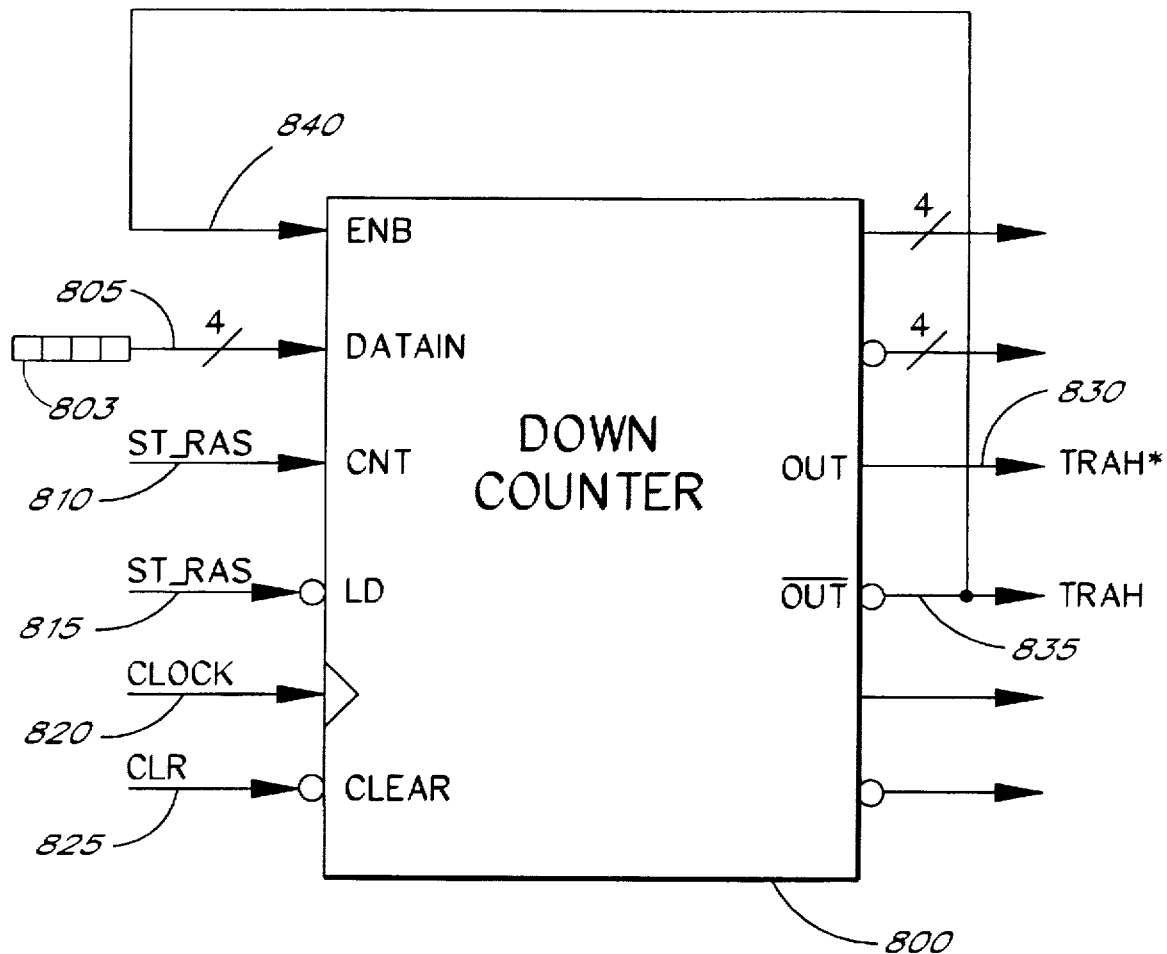

FIG. 10 depicts a down counter 800 which is exemplary of a plurality of down counters used within the present invention to provide timing signals within the DRAM sequencer control logic 300. In one embodiment, the down counter 800 comprises a binary down counter such as Model No. 74LS191 available from MOTOROLA.

The counter 800 includes a four-bit DATAIN input 805 which latches in a four-bit value. The four-bit value is indicative of the time period which the counter 800 measures, and may, for example, be input into a programmable register, schematically depicted in FIG. 10 as a register 803 connected to the bus input 805, based upon the specifications and the particular configuration of the DRAM 160. For example, the programmable register may advantageously be programmed by a software setup routine which configures a computer when the DRAM is installed. In this example, the counter 800 is to account for the time duration $t_{RAH}$ (see FIG. 3).

The counter 800 further includes a count input 810 which, in this particular example where the counter 800 is to account for the time period $t_{RAH}$, receives the RAS state (STRAS) signal. A load input 815 also receives the RAS state (STRAS) signal. A clock input 820 receives the DRAM internal clock pulse, while a clear input 825 receives the DRAM internal clear signal.

It should be noted here that the counter 800, as representative of each of the timing counters within the DRAM controller receives inputs indicative of the state of the DRAM 160, and further receives programmed timing value inputs stored within the register 803 by a technician based upon the configuration of the DRAM 160. However, the counter 800 does not receive inputs which are directly indicative of the state of the DRAM controller 220. Thus, the counter 800 operates independently of the output signals provided by the DRAM controller 220.

An output 830 provides the row address hold timing (TRAH) signal, while an output 835 provides the conjugate (i.e., inverted) TRAH* signal. The output 835 is fed back into an enable (ENB) input 840. Other outputs, well known to those of ordinary skill in the art, are also provided by the counter 800, but are not discussed here for the sake of simplicity.

In operation, the counter 800 receives a timing value via the input 805. Typically, the timing value is indicative of some time duration between one and fifteen cycles of the DRAM internal clock. The timing value is loaded while the RAS state (STRAS) signal remains unasserted, as determined by the load input 815. However, once the RAS state (STRAS) signal is asserted at the count input 810, this causes the counter 800 to count down from the initially loaded timing value to zero, where one binary bit is subtracted from the value in the counter upon the application of each clock pulse. Thus, once a sufficient number of clock cycles have elapsed, the down counter 800 reaches a value of zero, whereupon the row address hold timing (TRAH) signal is asserted at the outputs 830, 835. In this manner, a number of timing values may be used to indicate the appropriate delay times between selected ones of the memory access and control signals output to the DRAM 160 by the DRAM controller 220.

It should further be understood that the timing signals output by the counter 800 are not exclusively used to determine the times at which the memory accessing signals will be asserted. Rather, the outputs of the counter 800 are used to qualify the firing rules implemented by the logic circuitry depicted in FIGS. 7–9. Thus, the DRAM controller of the present invention is truly "rule-based" wherein the actual timing relations between the memory accessing signals is not set by simple timing circuits, but the outputs of the timing circuits are used as conditions which help to determine when a given memory accessing signal should be asserted.

Separate programmable counters (not shown) are provided for each of the timing signals generated by the DRAM controller of the present invention. Thus, the timing for each signal can be optimized for each parameter of the DRAM. In particular, the following table represents the signals on each of the inputs and outputs of the corresponding counters for each of the other timing signals generated by the present invention.

| INPUTS | | | OUTPUTS | |
|---|---|---|---|---|
| DATAIN | CNT | LD | OUT | OUT |
| TASR<7..4> | ST_MUX* | NEW_ROW* | TG_ASR | TG_ASR* |
| TASC<7..4> | ST_MUX | NEW_COL* | TG_ASC | TG_ASC* |
| TCAH<3..0> | ST_CAS | ST_CAS | TG_CAH | TG_CAH* |
| TCAS<7..4> | ST_CAS | ST_CAS | TG_CAS | TG_CAS* |
| TCP<3..0> | ST_CAS* | ST_CAS* | TG_CP | TG_CP* |
| TRSH<7..4> | ST_RAS | ST_CAS | TG_RSH | TG_RSH* |
| TRP<3..0> | ST_RAS* | ST_RAS* | TG_RP | TG_RP* |
| TCAC<7..4> | ST_CAS | ST_CAS | TG_CAC | TG_CAC* |
| TOFF<3..0> | ST_CAS* | ST_CAS* | TG_OFF | TG_OFF* |
| TRCD<7..4> | ST_CAS* | ST_RAS | TG_RCD | TG_RCD* |
| TCRP<3..0> | ST_RAS* | ST_CAS* | TG_CRP | TG_CRP* |
| TRPC<7..4> | ST_CAS* | ST_RAS* | TG_RPC | TG_RPC* |
| TRAS<3..0> | ST_RAS | ST_RAS | TG_RAS | TG_RAS* |
| TCSR<7..4> | ST_RAS* | ST_CAS | TG_CSR | TG_CSR* |
| TCHR<3..0> | ST_CAS | ST_RAS | TG_CHR | TG_CHR* |

Although the preferred embodiment of the present invention has been described and illustrated above, those skilled in the art will appreciate that various changes and modifications to the present invention do not depart from the spirit of the invention. For example, other specific implementations of the logic circuitry depicted in FIGS. 7–10 may be used to implement the rule-based DRAM controller 220. Accordingly, the scope of the present invention is limited only by the scope of the following appended claims.

What is claimed is:

1. A rule-based memory controller for use in a computer processor system, said system including a memory which provides a plurality of address locations for storing data and a plurality of access functions to access the data at said address locations, where each of said access functions is accessible by a series of events, said series of events comprising timing signals having multiple timing relations that are definable by a set of rules which govern the assertion of said timing signals, said memory controller comprising:

monitoring circuitry which monitors input signals that serve as pre-specified conditions for asserting said timing signals; and logic circuitry for implementing said multiple firing rules, said logic circuitry connected to said monitoring circuitry and responsive to said input signals to assert and unassert said memory accessing timing signals, said multiple firing rules allowing for accessing of said memory using said timing signals based upon said pre-specified conditions, said multiple firing rules being dependent upon a sequence of said access functions and a sequence of said address locations referenced by said sequence of access functions, said logic circuitry providing:

an idle state wherein all memory access signals are deasserted;

a precharge state wherein a plurality of memory address lines are asserted for a time period corresponding to a precharge time interval;

a first transition path from said idle state to said precharge state, said first transition path being taken when said plurality of address lines are asserted;

a column address state wherein a column address strobe is asserted for a time period corresponding to a column address hold interval;

a next column state wherein said column address strobe is deasserted for a time period corresponding to a column access precharge interval;

a second transition path from said column address state to said next column state, said second transition path taken whenever a subsequent memory access uses the same row address as a preceding memory access;

a third transition path from said next column state back to said column address state, said third transition taken upon the expiration of said column access precharge interval;

a CAS terminate transition path from said column address state to said idle state, said CAS terminate transition path taken when said subsequent memory access uses a different row address or when no subsequent memory access is needed;

a precharge terminate transition path from said precharge state to said idle state, said precharge terminate transition path provided to terminate a memory access operation from said precharge state; and a pagemode terminate transition path from said next column state to said idle state, said pagemode terminate path provided to terminate a memory access operation from said next column state.

2. A rule-based memory controller as defined in claim 1, further comprising a plurality of programmable timing registers which communicate with said monitoring circuitry and said logic circuitry, wherein timing data stored within said timing registers serve as inputs which qualify said firing rules.

3. A rule-based memory controller as defined in claim 2, wherein said monitoring circuit includes a plurality of counters, and said timing registers provide data inputs to said counters.

4. A rule-based memory controller as defined in claim 1, wherein said memory circuit comprises a dynamic random access memory (DRAM).

5. A rule-based memory controller as defined in claim 1, wherein said computer processing system is a multi-processor system.

6. A rule-based memory controller as defined in claim 1, wherein said logic circuitry comprises row address select logic.

7. A rule-based memory controller as defined in claim 1, wherein said logic circuitry comprises column address select logic.

8. The rule based memory controller of claim 1, said logic circuitry further providing:

a page-wait state which is entered whenever a subsequent memory access specifies the same row but a different memory bank than a preceding memory access; and a transition path from said column address state to said page-wait state.

9. The rule based memory controller of claim 8, said logic circuitry further providing:

a column address setup state providing a delay to allow for proper column address setup between accesses to different memory banks;

a transition path from said page-wait state to said column address setup state;

a same-page transition path from said column address setup state to said column address state, said same-page transition path taken whenever a subsequent memory access references the same page as the preceding memory access; and a different-page transition path from said column address setup state to said column address state, said different-page transition path taken whenever a subsequent memory access references a different page than the preceding memory access.

* * * * *